United States Patent
Asaoka et al.

(10) Patent No.: US 11,903,287 B2
(45) Date of Patent: Feb. 13, 2024

(54) LIGHT EMITTING ELEMENT, LIGHT EMITTING DEVICE, AND METHOD FOR MANUFACTURING LIGHT EMITTING ELEMENT

(71) Applicant: SHARP KABUSHIKI KAISHA, Sakai (JP)

(72) Inventors: Yasushi Asaoka, Sakai (JP); Tsuyoshi Kamada, Sakai (JP); Shigeru Aomori, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 456 days.

(21) Appl. No.: 17/277,627

(22) PCT Filed: Sep. 21, 2018

(86) PCT No.: PCT/JP2018/035192
§ 371 (c)(1),
(2) Date: Mar. 18, 2021

(87) PCT Pub. No.: WO2020/059143
PCT Pub. Date: Mar. 26, 2020

(65) Prior Publication Data
US 2021/0351244 A1 Nov. 11, 2021

(51) Int. Cl.
*H10K 59/35* (2023.01)
*H10K 50/11* (2023.01)
(Continued)

(52) U.S. Cl.
CPC ............ *H10K 59/35* (2023.02); *H10K 50/11* (2023.02); *H10K 59/352* (2023.02);
(Continued)

(58) Field of Classification Search
CPC ........ H10K 59/35; H10K 50/11; H10K 71/00; H10K 50/115; H10K 2101/40;
(Continued)

(56) References Cited

U.S. PATENT DOCUMENTS 9,059,113 B2 * 6/2015 Kwon ..................... H10K 59/35
9,590,139 B1 * 3/2017 Lai .......................... H01L 33/06
(Continued)

FOREIGN PATENT DOCUMENTS

JP 2003317968 A 11/2003
JP 2006032757 A 2/2006
(Continued)

*Primary Examiner* — David Vu
*Assistant Examiner* — Brandon C Fox
(74) *Attorney, Agent, or Firm* — ScienBiziP, P.C.

(57) ABSTRACT

A light-emitting element includes: pixel electrodes provided for individual subpixels of at least three colors; a common electrode provided facing each of the pixel electrodes; and light-emitting layers of each color provided between the common electrode and, respectively, each of the pixel electrodes, wherein one of each of the pixel electrodes and the common electrode is a cathode electrode and the other is an anode electrode and among the light-emitting layers of the at least three colors, a light-emitting layer of a color having a largest electron affinity extends in a state of being layered between the cathode electrode and each light-emitting layer of the other colors as well.

20 Claims, 15 Drawing Sheets

(51) Int. Cl.
*H10K 71/00* (2023.01)
*H10K 50/115* (2023.01)
*H10K 101/40* (2023.01)
*H05B 33/22* (2006.01)
*H10K 102/00* (2023.01)

(52) U.S. Cl.
CPC .......... *H10K 59/353* (2023.02); *H10K 71/00* (2023.02); *H05B 33/22* (2013.01); *H10K 50/115* (2023.02); *H10K 2101/40* (2023.02); *H10K 2102/321* (2023.02)

(58) Field of Classification Search
CPC .......... H10K 2102/321; H10K 59/353; H10K 59/352; H05B 33/22
See application file for complete search history.

(56) References Cited

U.S. PATENT DOCUMENTS

| | | | |
|---|---|---|---|
| 10,892,432 B2* | 1/2021 | Niboshi | H10K 59/35 |
| 2006/0017376 A1 | 1/2006 | Okinaka et al. | |
| 2008/0007164 A1 | 1/2008 | Suzuki et al. | |
| 2010/0019236 A1 | 1/2010 | Okinaka et al. | |
| 2010/0109518 A1 | 5/2010 | Suzuki et al. | |
| 2011/0089822 A1 | 4/2011 | Okinaka et al. | |
| 2011/0180825 A1 | 7/2011 | Lee et al. | |
| 2011/0291071 A1 | 12/2011 | Kim et al. | |
| 2012/0217489 A1 | 8/2012 | Suzuki et al. | |
| 2013/0048970 A1 | 2/2013 | Matsuda | |
| 2013/0056705 A1 | 3/2013 | Kim et al. | |
| 2013/0069036 A1 | 3/2013 | Miyata | |
| 2014/0284566 A1* | 9/2014 | Yoo | H10K 50/852 257/89 |
| 2015/0155515 A1* | 6/2015 | Kim | H10K 71/00 438/35 |
| 2017/0271605 A1 | 9/2017 | Steckel et al. | |
| 2018/0083226 A1* | 3/2018 | Ichikawa | H10K 59/12 |
| 2018/0097043 A1* | 4/2018 | Song | G02B 27/017 |
| 2018/0108842 A1 | 4/2018 | Li et al. | |
| 2018/0143469 A1* | 5/2018 | Cui | G02F 1/1336 |
| 2019/0312220 A1* | 10/2019 | Tsukamoto | G09F 9/30 |
| 2021/0028385 A1* | 1/2021 | Sakakibara | H10K 50/115 |

FOREIGN PATENT DOCUMENTS

| | | |
|---|---|---|
| JP | 2008282957 A | 11/2008 |
| JP | 2011155004 A | 8/2011 |
| JP | 2013051161 A | 3/2013 |
| JP | 2013056412 A | 3/2013 |
| JP | 2016197748 A | 11/2016 |
| JP | 2018091924 A | 6/2018 |
| WO | 2011/148791 A1 | 12/2011 |

* cited by examiner

LIGHT EMITTING ELEMENT, LIGHT EMITTING DEVICE, AND METHOD FOR MANUFACTURING LIGHT EMITTING ELEMENT

TECHNICAL FIELD

The disclosure relates to a light-emitting element including light-emitting layers of each color, a light-emitting device including the light-emitting element, and a manufacturing method of a light-emitting element.

BACKGROUND ART

Examples of a method of color display of an organic electroluminescent (EL) element include a three-color separate-patterning method in which films of luminescent materials of each color of red (R), green (G), and blue (B) are formed. In this method, the respective luminescent materials of red (R), green (G), and blue (B) are thermally deposited using a metal shadow mask that has been finely patterned.

In this case, the metal shadow mask is expensive, and thus development has advanced to reduce the number of uses.

For example, an organic light-emitting display device 100 disclosed in PTL 1 includes, as illustrated in FIG. 15, first electrodes 120 provided for each of a red subpixel R, a green subpixel G, and a blue subpixel B on an upper portion of a substrate 101, a hole injection layer 131 provided to the upper portion of the substrate 101 so as to cover each of the first electrodes 120, a hole transport layer 133 provided to an upper portion of the hole injection layer 131, an auxiliary layer 132R provided between the hole injection layer 131 and the hole transport layer 133 in the red subpixel R, a red light-emitting layer 134R and a green light-emitting layer 134G formed sequentially between the hole transport layer 133 in the red subpixel R and between the hole transport layer 133 in the green subpixel G and an electron transport layer 135, and a blue light-emitting layer 134B provided between the hole transport layer 133 and the electron transport layer 135 in the blue subpixel B.

In this configuration, the red light-emitting layer 134R and the green light-emitting layer 134G are provided in a layered manner, and the red subpixel R and the green subpixel G are provided as common layers. As a result, further use of a metal shadow mask to form the auxiliary layer 132R in the green subpixel G is unnecessary. Therefore, steps can be simplified by using the metal shadow mask four times.

CITATION LIST

Patent Literature

PTL 1: JP 2011-155004 A

SUMMARY

Technical Problem

Nevertheless, in the light-emitting element of a separate-patterning type such as the organic light-emitting display device disclosed in PTL 1 of the related art described above, there is a problem in that the separate-patterning of the light-emitting layers needs to be performed at least three times for the red subpixel R, the green subpixel G, and the blue subpixel B, lengthening the process steps as well.

The disclosure has been made in view of the above-mentioned problems in the related art, and an object of the disclosure is to provide a light-emitting element, a light-emitting device, and a manufacturing method of a light-emitting element capable of reducing the number of times of patterning of light-emitting layers of each color.

Solution to Problem

A light-emitting element according to an aspect of the disclosure, in order to solve the above-described problems, includes pixel electrodes provided for individual subpixels of at least three colors, a common electrode provided facing each of the pixel electrodes, and light-emitting layers of each color provided between the common electrode and, respectively, each of the pixel electrodes. One of each of the pixel electrodes and the common electrode is a cathode electrode and the other is an anode electrode and, among the light-emitting layers of the at least three colors, a light-emitting layer of a color having a largest electron affinity extends in a state of being layered between the cathode electrode and each light-emitting layer of the other colors as well.

A light-emitting device according to an aspect of the disclosure, in order to solve the above-described problems, includes the light-emitting element.

A manufacturing method of a light-emitting element according to an aspect of the disclosure is a manufacturing method of a light-emitting element including pixel electrodes provided for individual subpixels of at least three colors, a common electrode provided facing each of the pixel electrodes, and light-emitting layers of each color provided between the common electrode and, respectively, each of the pixel electrodes. The manufacturing method includes a cathode electrode and anode electrode formation step of forming one of each of the pixel electrodes and the common electrode as a cathode electrode and the other as an anode electrode, and an extension step of extending, among the light-emitting layers of the at least three colors, a light-emitting layer of a color having a largest electron affinity in a state of being layered between the cathode electrode and each light-emitting layer of the other colors as well.

Advantageous Effects of Disclosure

According to an aspect of the disclosure, an effect of providing a light-emitting element, a light-emitting device, and a manufacturing method of a light-emitting element capable of reducing the number of times of patterning of light-emitting layers of each color is exhibited.

DESCRIPTION OF EMBODIMENTS

First Embodiment

The following describes one embodiment of the disclosure with reference to FIG. 1 to FIG. 8.

Basic Configuration of Light-Emitting Element

Figure 1:
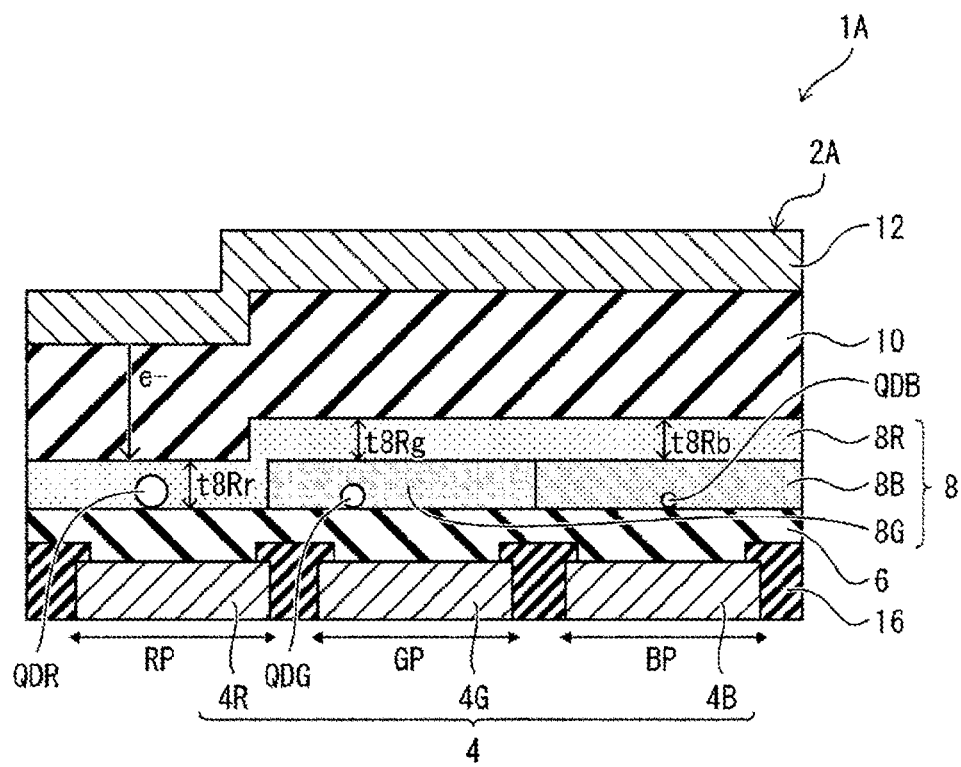
FIG. 1 is a cross-sectional view illustrating a configuration of a light-emitting device including a light-emitting element according to a first embodiment of the disclosure.

A light-emitting element of the present embodiment is applied to a light-emitting element including quantum dots. First, a basic configuration of a light-emitting device 1A including a light-emitting element 2A according to an embodiment of the disclosure will be described with reference to FIG. 1. FIG. 1 is a cross-sectional view illustrating the basic configuration of the light-emitting device 1A including the light-emitting element 2A according to the present embodiment.

The light-emitting device 1A including the light-emitting element 2A of the basic configuration according to the present embodiment has a structure in which respective layers of the light-emitting element 2A are layered on an array substrate in which a thin film transistor (TFT; not illustrated) is formed, as illustrated in FIG. 1. Note that, in the present specification, a direction from the light-emitting element 2A to the array substrate of the light-emitting device 1A is referred to as "downward," and a direction from the array substrate to the light-emitting element 2A of the light-emitting device 1A is referred to as "upward."

The light-emitting element 2A includes a hole transport layer 6, a light-emitting layer 8, an electron transport layer 10, and a cathode electrode 12 on an anode electrode 4, in this order. The anode electrode 4 of the light-emitting element 2A formed in an upper layer of the array substrate (not illustrated) is electrically connected to the TFT of the array substrate. As a result, the light-emitting element 2A of the basic configuration of the present embodiment is a light-emitting element having a so-called normal structure.

Here, in the present embodiment, the anode electrode 4 is separated into a red subpixel RP, a green subpixel GP, and a blue subpixel BP by an edge cover 16 composed of an insulating layer. As a result, the anode electrode 4 is separated into a red pixel anode electrode 4R, a green pixel anode electrode 4G, and a blue pixel anode electrode 4B by the edge cover 16. The hole transport layer 6 is formed covering the edge cover 16. In the light-emitting layer 8, sections are separated at positions of the edge cover 16 into a red pixel light-emitting layer 8R as a red quantum dot light-emitting layer, a green pixel light-emitting layer 8G as a green quantum dot light-emitting layer, and a blue pixel light-emitting layer 8B as a blue quantum dot light-emitting layer. However, separation is not made by the edge cover 16.

Note that the electron transport layer 10 and the cathode electrode 12 are not separated by the edge cover 16 and are commonly formed. As illustrated in FIG. 1, the edge cover 16 may be formed in a position covering a side surface and the vicinity of a peripheral end portion of an upper face of the cathode electrode 4.

As a result of the above-described configuration, in the light-emitting element 2A according to the present embodiment, the red subpixel RP is formed by the red pixel anode electrode 4R having an island shape, and the hole transport layer 6, the electron transport layer 10, and the cathode electrode 12, which are common. Similarly, the green subpixel GP is formed by the green pixel anode electrode 4G having an island shape, and the hole transport layer 6, the electron transport layer 10, and the cathode electrode 12, which are common. Similarly, the blue subpixel BP is formed by the blue pixel anode electrode 4B having an island shape, and the hole transport layer 6, the electron transport layer 10, and the cathode electrode 12, which are common. In the light-emitting layer 8, in the present embodiment, the red pixel light-emitting layer 8R is formed between the red pixel anode electrode 4R and the cathode electrode 12, the green pixel light-emitting layer 8G and the red pixel light-emitting layer 8R are layered and formed between the green pixel anode electrode 4G and the cathode electrode 12, and the blue pixel light-emitting layer 8B and the red pixel light-emitting layer 8R are layered and formed between the blue pixel anode electrode 4B and the cathode electrode 12. Note that, as described above, the light-emitting element 2A of the present embodiment is composed of the subpixels of three colors of the red subpixel RP, the green subpixel GP, and the blue subpixel BP.

In the present embodiment, the red pixel light-emitting layer 8R included in the red subpixel RP emits red light, the green pixel light-emitting layer 8G included in the green subpixel GP emits green light, and the blue pixel light-emitting layer 8B included in the blue subpixel BP emits blue light. That is, the light-emitting element 2A includes subpixels for each light emission wavelength of the light-emitting layer 8. However, the light-emitting element 2A commonly includes the hole transport layer 6, the electron transport layer 10, and the cathode electrode 12 in all subpixels.

Here, the red light is light having a light emission central wavelength in a wavelength band longer than 600 nm and shorter than or equal to 780 nm. Further, the green light is light having a light emission central wavelength in a wavelength band longer than 500 nm and shorter than or equal to 600 nm. Furthermore, the blue light is light having a light emission central wavelength in a wavelength band from 400 nm to 500 nm.

In the light-emitting element 2A according to the present embodiment, one group including one red subpixel RP, one green subpixel GP, and one blue subpixel BP is one pixel in the light-emitting element 2A. Note that, while in the present embodiment there are the at least three subpixels of the red subpixel RP, the green subpixel GP, and the blue subpixel BP, subpixels of other colors may be included. That is, in one aspect of the disclosure, the subpixels of at least the three colors of red, green, and blue need only be included.

The anode electrode 4 and the cathode electrode 12 include conductive materials and are electrically connected to the hole transport layer 6 and the electron transport layer 10, respectively. One of the anode electrode 4 and the cathode electrode 12 is a transparent electrode. In the present embodiment, the cathode electrode 12 is a transparent electrode and, for example, ITO, IZO, AZO, GZO, $In_2O_3$, thin Ag, thin alloys including Ag, Ag nanowires or carbon nanotubes, and graphene are used. The cathode electrode 12 can be formed as a film by, for example, sputtering, vacuum vapor deposition, or solution application. One of the anode electrode 4 and the cathode electrode 12 may include a metal material having high reflectivity. In the present embodiment, the anode electrode 4 includes a metal material. As the metal material, Al, Cu, Au, Ag, Mg, Pt, Pd, Ni, Nd, Ir, Cr, alloys thereof, and the like having high visible light reflectivity, and a multilayer film containing these are preferable. The light-emitting element 2A can extract light from the electrode side provided with the transparent electrode. Accordingly, in the present embodiment, the light-emitting element 2A can extract light from the cathode electrode 12 side.

The light-emitting layer 8 emits light due to the occurrence of recombination between positive holes $h^+$ transported from the anode electrode 4 and electrons $e^-$ transported from the cathode electrode 12. In the present embodiment, a plurality of quantum dots (semiconductor nanoparticles) emitting the same color are provided in each subpixel as the luminescent material. The quantum dots may be the same material or have different luminescent colors due to particle size, and the light wavelength decreases as particle size decreases. Accordingly, quantum dots that emit the same color mean quantum dots of the same particle size and the same material. The "particle size" of the quantum dots illustrated here is a design value, and specifically refers to a median particle size measured by dynamic light scattering or a transmission electron microscope. The particle sizes of individual quantum dots include variations and may have variations of about 20%.

As illustrated in FIG. 1, the light-emitting layer 8 includes a red quantum dot QDR in the red pixel light-emitting layer 8R, a green quantum dot QDG in the green pixel light-emitting layer 8G, and a blue quantum dot QDB in the blue pixel light-emitting layer 8B. That is, the light-emitting layer 8 includes quantum dots of a plurality of types.

The light-emitting layer 8 can be film-formed by separately patterning for each subpixel by using a dispersion liquid in which quantum dots are dispersed in a solvent such as hexane or toluene by a spin coating method, an ink-jet method, or the like. The dispersion liquid may be mixed with a dispersion material such as thiol or amine.

The red quantum dot QDR, the green quantum dot QDG, and the blue quantum dot QDB are each a luminescent material having energy of a valence band level V.B. (equivalent to ionization potential) and a conduction band level C.B. (equivalent to electron affinity), and emit light by the recombination between the positive holes of the valence band level V.B. and the electrons of the conduction band level C.B. Because light emission from the red quantum dot QDR, the green quantum dot QDG, and the blue quantum dot QDB has a narrower spectrum due to a quantum confinement effect, it is possible to obtain light emission with relatively deep chromaticity.

The red quantum dot QDR, the green quantum dot QDG, and the blue quantum dot QDB may include one or a plurality of semiconductor materials selected from a group including, for example, Cd, S, Te, Se, Zn, In, N, P, As, Sb, Al, Ga, Pb, Si, Ge, Mg, and compounds thereof. Further, the red quantum dot QDR, the green quantum dot QDG, and the blue quantum dot QDB may be a two-component core type, a three-component core type, a four-component core type, a core-shell type, or a core multi-shell type. Furthermore, the red quantum dot QDR, the green quantum dot QDG, and the blue quantum dot QDB may include doped nanoparticles or may have a composition gradient structure. In the present embodiment, the red quantum dot QDR, the green quantum dot QDG, and the blue quantum dot QDB have a core-shell type structure including CdSe as a core, ZnS, and ZnS as a shell. Note that, in the case of the core-shell type and the core multi-shell type described above, the particle size of the quantum dot includes the shell portion, which appears larger than the particle size of the core contributing to the light emission wavelength. The "particle size" of the quantum dot according to one aspect of the disclosure refers to the particle size of the core contributing to the light emission wavelength.

The hole transport layer 6 transports the positive holes $h^+$ from the anode electrode 4 to the light-emitting layer 8. The hole transport layer 6 may have a function of inhibiting transport of the electrons $e^-$. The hole transport layer 6 is composed of an inorganic material and is composed of NiO, for example. The hole transport layer 6 may be formed as a film by sputtering.

The electron transport layer 10 transports the electrons $e^-$ from the cathode electrode 12 to the light-emitting layer 8. The electron transport layer 10 may have a function of inhibiting transport of the positive holes $h^+$. The electron transport layer 10 may include, for example, ZnO, $TiO_2$, MgZnO, $Ta_2O_3$, $SrTiO_3$, or $Mg_xZn_{1-x}O$, or may include a plurality of materials among them for each subpixel. The electron transport layer 10 may be formed by applying colloidal particles made from sputtering or the electron transport layer material.

Figure 2:
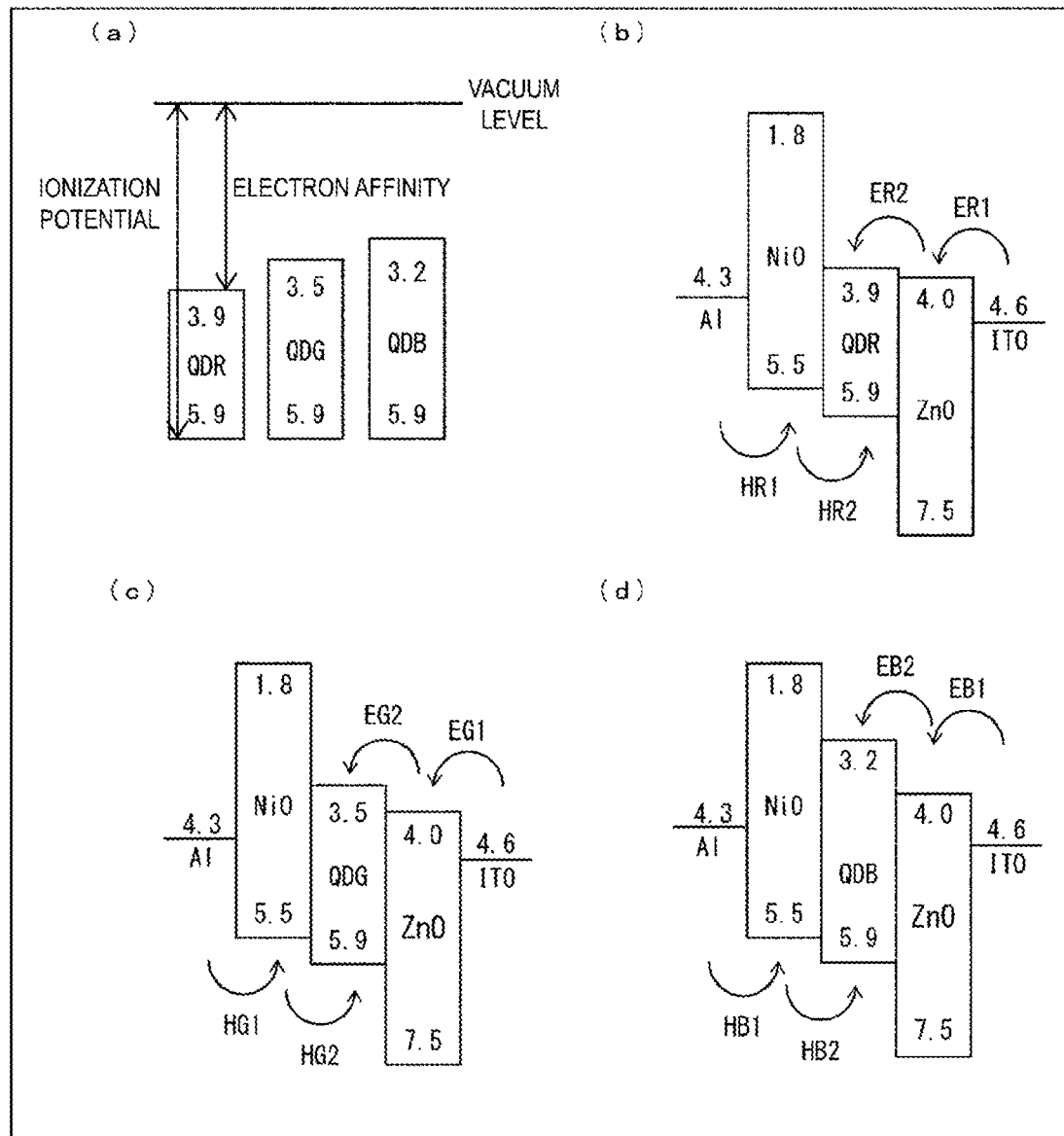
FIG. 2(*a*) is an energy band diagram illustrating an electron affinity and an ionization potential of each of a red pixel light-emitting layer, a green pixel light-emitting layer, and a blue pixel light-emitting layer of the light-emitting element according to the present embodiment, and FIGS. 2(*b*), 2(*c*), and 2(*d*) are energy band diagrams, each illustrating an example of an electron affinity and an ionization potential of each layer of a red subpixel, a green subpixel, and a blue subpixel of a typical light-emitting element using an example of a material used in the present embodiment.

Next, the energy illustrating an example of the valence band level V.B. (equivalent to ionization potential) and the conduction band level C.B. (equivalent to electron affinity) in each layer used in the light-emitting element 2A according to the present embodiment will be described with reference to (a), (b), (c), and (d) of FIG. 2. (a) of FIG. 2 is an energy band diagram illustrating an example of an electron affinity and an ionization potential of the material used for each of the red pixel light-emitting layer 8R, the green pixel light-emitting layer 8G, and the blue pixel light-emitting layer 8B. (b), (c), and (d) of FIG. 2 are energy band diagrams illustrating an example of an electron affinity and an ionization potential in each layer of the red subpixel, the green subpixel, and the blue subpixel of a typical quantum dot light-emitting element. That is, (a), (b), (c), and (d) of FIG. 2 illustrate a quantum dot light-emitting element in a case in which each of the light-emitting layers of each color is constituted by one layer. Note that (b), (c), and (d) of FIG. 2 each illustrate the energy band diagram of the anode electrode, the hole transport layer, the light-emitting layer, the electron transport layer, and the cathode electrode in each subpixel, from the right to the left. Further, in the anode electrode and the cathode electrode, a Fermi level of each of the electrodes is indicated in eV. An ionization potential of each layer with reference to the vacuum level is indicated in eV below the hole transport layer, the light-emitting layer, and the electron transport layer. Further, an electron affinity of each layer with reference to the vacuum level is indicated in eV above the hole transport layer, the light-emitting layer, and the electron transport layer. Below, in the description, both the ionization potential and the electron affinity are assumed to be based on the vacuum level when the ionization potential and the electron affinity are described simply in the present specification.

The valence band level V.B. (equivalent to ionization potential) of the quantum dots is substantially the same value in a case of the same material system, regardless of a wavelength of light emitted from the quantum dots. This is because a lower atomic number of the elements constituting the core of the quantum dots has a small, closed shell orbit, and an atomic nucleus is less likely to be shielded by the closed shell orbit, and thus a valence electron is more likely to be affected by an electric field created by the atomic nucleus and tends to remain at a constant energy level. Therefore, the valence band level is also constant regardless of the luminescent color of the quantum dots. For example, when comparing HgSe, CdSe, and ZnSe as the material of the core, Cd and even Zn have a smaller atomic number than Hg. Thus, in CdSe or ZnSe, the valence band level is constant regardless of the luminescent color.

On the other hand, the conduction band level C.B. (equivalent to electron affinity) of the quantum dots differs depending on a wavelength of light emitted from the quantum dots. Particularly, the conduction band level C.B. of the quantum dots has a deeper energy level as a wavelength of light emitted from the quantum dots is longer, and has a lower energy level as a wavelength of light emitted from the quantum dots is shorter. This is because the change in the valence band level V.B. of the quantum dots is small and therefore the quantum dots with a smaller band gap have a deeper conduction band level C.B.

For example, in the light-emitting layer material used in the present embodiment, as illustrated in (a) of FIG. 2, the red pixel light-emitting layer 8R, the green pixel light-emitting layer 8G, and the blue pixel light-emitting layer 8B each have an ionization potential of 5.9 eV and substantially the same value among different subpixels. On the other hand, in the present embodiment, as illustrated in (a) of FIG. 2, the red pixel light-emitting layer 8R, the green pixel light-emitting layer 8G, and the blue pixel light-emitting layer 8B have an electron affinity of 3.9 eV, 3.5 eV and 3.2 eV, respectively. That is, the red pixel light-emitting layer 8R has the largest electron affinity.

As an example of the material configuration used in the present embodiment, a case in which the anode electrode 4 is made of Al and a case in which the cathode electrode 12 is made of ITO is illustrated. In this case, the Fermi level of the anode electrode 4 is 4.3 eV, and the Fermi level of the cathode electrode 12 is 4.6 eV.

In a typical light-emitting element that uses the material used in the present embodiment, as illustrated in (b) of FIG. 2, in the red subpixel, the red pixel hole transport layer contains NiO, for example, and the red pixel hole transport layer of NiO has an ionization potential of 5.5 eV and an electron affinity of 1.8 eV. Further, as illustrated in (c) of FIG. 2, in the green subpixel, the green pixel hole transport layer contains NiO, for example, and the green pixel hole transport layer of NiO has an ionization potential of 5.5 eV and an electron affinity of 1.8 eV. Furthermore, as illustrated in (d) of FIG. 2, in the blue subpixel, the blue pixel hole transport layer contains NiO, for example, and the blue pixel hole transport layer of NiO has an ionization potential of 5.5 eV and an electron affinity of 1.8 eV.

As illustrated in (b), (c), and (d) of FIG. 2, in a light-emitting device using the example of the material used in the present embodiment, the positive holes $h^+$ are injected from the anode electrode toward the light-emitting layer and the electrons $e^-$ are injected from the cathode electrode toward the light-emitting layer by applying a potential difference between the anode electrode and the cathode electrode. Specifically, the positive holes $h^+$ reach the light-emitting layer from the anode electrode via the hole transport layer, and the electrons $e^-$ reach the light-emitting layer from the cathode electrode via the electron transport layer.

The positive holes h⁺ and the electrons e⁻ that have reached the light-emitting layer are recombined at the quantum dots QDR, QDG, and QDB in each of the subpixels to emit light. Light emitted from the quantum dots QDR, QDG, and QDB may be, for example, reflected by the anode electrode, which is a metal electrode, transmitted through the cathode electrode, which is a transparent electrode, and radiated to the outside of the light-emitting device.

A state in which the positive holes h⁺ and the electrons e⁻ are transported in each layer of the light-emitting element will be described with reference to (b), (c), and (d) of FIG. 2.

When a potential difference arises between the anode electrode and the cathode electrode, the positive holes h⁺ are injected from the anode electrode into the hole transport layer 6 in each subpixel, as illustrated by arrows HR1, HG1, and HB1 in (b), (c), and (d) of FIG. 2. Similarly, the electrons e⁻ are injected from the cathode electrode to the electron transport layer, as illustrated by arrows ER1, EG1, and EB1 in (b), (c), and (d) of FIG. 2.

Here, for example, a barrier of the hole transport from a first layer to a second layer different from the first layer is indicated by energy obtained by subtracting the ionization potential of the first layer from the ionization potential of the second layer. Therefore, the barriers of positive hole injection indicated by the arrows HR1, HG1, and HB1 are each 1.2 eV.

Further, for example, a barrier of the electron transport from a first layer to a second layer different from the first layer is indicated by energy obtained by subtracting the electron affinity of the second layer from the electron affinity of the first layer. Therefore, the barriers of electron injection indicated by the arrows ER1, EG1, and EB1 are each 0.6 V.

Next, as indicated by arrows HR2, HG2, and HB2 in (b), (c), and (d) of FIG. 2, the positive holes h⁺ injected into the hole transport layer are transported to the light-emitting layer in each of the subpixels. Here, the barriers of the hole injection indicated by the arrows HR2, HG2, HB2 are each 0.4 eV. Further, the barriers of electron transport indicated by arrows ER2, EG2, and EB2 are 0.1 eV, 0.5 eV, and 0.8 eV, respectively. That is, from the electron transport layer to the light-emitting layer, the red pixel light-emitting layer has the lowest barrier and thus the electrons e⁻ are more likely transported, and the blue pixel light-emitting layer has the highest barrier and thus the electrons e⁻ are less likely transported.

Thus, the positive holes h⁺ and the electrons e⁻ transported to the light-emitting layer 8 are recombined at the quantum dots QDR, QDG, and QDB.

In general, in a light-emitting element including a light-emitting layer in which quantum dots are layered, the quantum dots are preferably layered in five to ten layers in a thickness direction. That is, recombination of electrons and positive holes in the quantum dots occurs at a thickness of approximately five or less quantum dots near an end surface on the anode electrode side of the light-emitting layer, and tends to less likely occur on the cathode electrode side than near the center. Accordingly, when the number of layers of quantum dots in the light-emitting layer is too large, electrical resistance increases, leading to problems such as a rise in drive voltage and a decrease in luminous efficiency.

Form of Light-Emitting Layer

Figure 3:
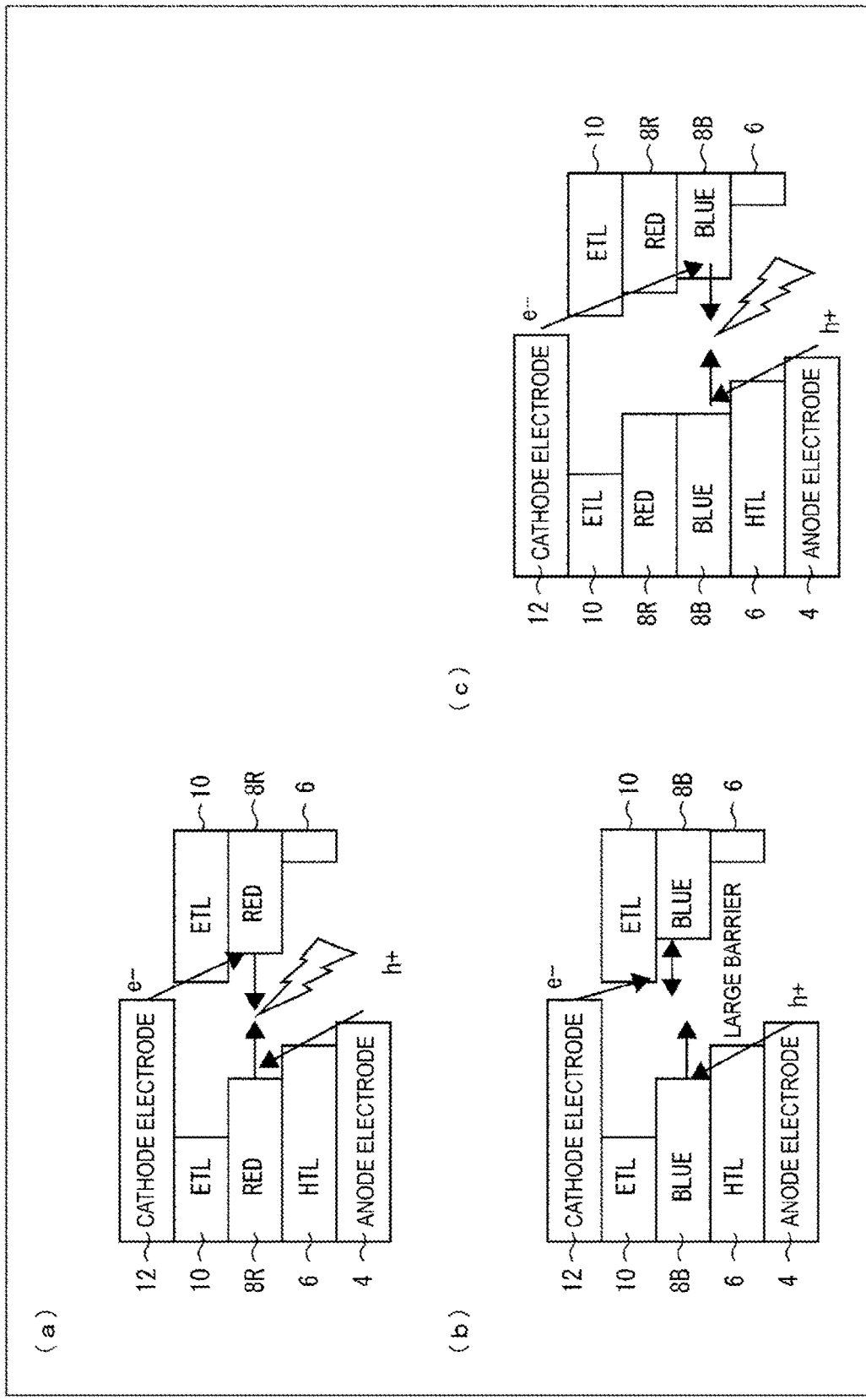
FIG. 3(a) is a cross-sectional view illustrating a luminous efficiency when the light-emitting layer is red quantum dots.
FIG. 3(b) is a cross-sectional view illustrating a luminous efficiency when the light-emitting layer is blue quantum dots.
FIG. 3(c) is a cross-sectional view illustrating a luminous efficiency when the red quantum dots and the blue quantum dots are layered in the light-emitting layer.

The form of the light-emitting layer of the light-emitting element 2A of the present embodiment will be described with reference to FIG. 1 and (a), (b), and (c) of FIG. 3. FIG. 1 is a cross-sectional view illustrating a configuration of the light-emitting device 1A including the light-emitting element 2A according to the present embodiment. (a) of FIG. 3 is a cross-sectional view illustrating the luminous efficiency when the light-emitting layer 8 is the red pixel light-emitting layer 8R. (b) of FIG. 3 is a cross-sectional view illustrating the luminous efficiency when the light-emitting layer 8 is the blue pixel light-emitting layer 8B. (c) of FIG. 3 is a cross-sectional view illustrating the luminous efficiency when the red pixel light-emitting layer 8R and the blue pixel light-emitting layer 8B are layered in the light-emitting layer 8.

As described above, the light-emitting element 2A of the light-emitting device 1A of the present embodiment includes a subpixel electrode provided for each subpixel in a pixel including subpixels of at least three colors to apply a voltage, the cathode electrode 12, which is as a common electrode provided facing each subpixel electrode, and quantum dot light-emitting layers of each color respectively provided between the subpixel electrodes and the cathode electrode 12.

In this type of light-emitting element 2A, the pixel includes the subpixels of at least three colors, and thus three quantum dot light-emitting layers of each color are also required for each color. Therefore, in the patterning of the quantum dot light-emitting layers of each color, at least three types of pattern masks are required, and the patterning step is repeated at least three times, thereby lengthening the process steps. Further, the pattern mask is not inexpensive and thus cost increases.

Here, in the present embodiment, as illustrated in FIG. 1, the electron transport layer 10 is commonly provided between the quantum dot light-emitting layers of each color and the cathode electrode 12. Further, among the quantum dot light-emitting layers of the three colors, the red pixel light-emitting layer 8R of a color having the largest electron affinity extends in a state of being layered between the electron transport layer 10 and the quantum dot light-emitting layers of the other colors, that is, between the cathode electrode 12 and the quantum dot light-emitting layers of the other colors as well.

Specifically, the subpixels of three colors are the red subpixel RP, the green subpixel GP, and the blue subpixel BP, and the quantum dot light-emitting layers of each color are the red pixel light-emitting layer 8R, the green pixel light-emitting layer 8G, and the blue pixel light-emitting layer 8B. Then, the red pixel light-emitting layer 8R having the largest electron affinity extends in a state of being layered between the electron transport layer 10 and the green pixel light-emitting layer 8G and the blue pixel light-emitting layer 8B of the other colors.

As illustrated in FIG. 1, the cathode electrode 12, which is a common electrode, is commonly formed in the plurality of pixels.

Further, in the light-emitting layer 8, the red pixel light-emitting layer 8R is not patterned and covers the entire pixel. The green pixel light-emitting layer 8G is patterned, but does not cover the red subpixel RP and the blue subpixel BP. The blue pixel light-emitting layer 8B is patterned in a state of not covering the red subpixel RP and the green subpixel GP.

The anode electrode 4 is divided into the red subpixel RP, the green subpixel GP, and the blue subpixel BP, and a voltage different from that of the adjacent subpixel can be applied to each.

One of the anode electrode 4 or the cathode electrode 12 has visible light transparency. Further, work functions of the anode electrode 4 and the cathode electrode 12 are different. The anode electrode 4 is connected to a thin film transistor (TFT) provided to an array substrate (not illustrated). In the present embodiment, the electron transport layer 10 is further provided between the light-emitting layer 8 and the cathode electrode 12. An electron injection layer (not illustrated) may be provided between the electron transport layer 10 and the cathode electrode 12. In the present embodiment, the electron transport layer 10 is commonly provided in all pixels, and the electron transport layer 10 covers the light-emitting layer 8 in its entirety. In FIG. 1, the edge cover 16 composed of an insulating layer covers up to each edge portion of the subpixels of the anode electrode 4, but the edge cover 16 need not cover up to each edge portion of the sub pixels.

Here, in the light-emitting element 2A including the quantum dots, a mobility of the positive holes $h^+$ in the light-emitting layer 8 is low compared to a mobility of the electrons $e^-$. Therefore, in the light-emitting element 2A, light is emitted on the anode electrode 4 side of the light-emitting layer 8. That is, light is emitted at a boundary between the light-emitting layer 8 and the hole transport layer 6 in the light-emitting layer 8.

In the light-emitting element 2A having the configuration described above, the green pixel light-emitting layer 8G and the blue pixel light-emitting layer 8B, which are different from the red pixel light-emitting layer 8R of the color having the largest electron affinity among the quantum dot light-emitting elements of the at least three colors, are patterned and formed. On the other hand, the red pixel light-emitting layer 8R of the color having the largest electron affinity among the quantum dot light-emitting layers of the three colors is not patterned and is formed covering entire surfaces of the red subpixel RP, the green subpixel GP, and the blue subpixel BP. Accordingly, the red pixel light-emitting layer 8R having the largest electron affinity among the quantum dot light-emitting layers of the three colors does not require a patterning step. Therefore, it is sufficient to perform the entire patterning step twice for the two colors of the green pixel light-emitting layer 8G and the blue pixel light-emitting layer 8B. Therefore, an increase in the length of the process steps can be suppressed and the cost associated with the pattern mask can be reduced.

However, when the light-emitting layer 8 is formed into such a layered structure, the red pixel light-emitting layer 8R having the largest electron affinity among the quantum dot light-emitting layers of the three colors is formed in a state of being layered between the green pixel light-emitting layer 8G and the blue pixel light-emitting layer 8B of the other colors, and thus whether or not the desired color can be emitted is problematic. Regarding this problem, as described above, in the light-emitting element 2A including the quantum dot light-emitting layers of each color, the mobility of the positive hole $h^+$ is low, and thus, in the light-emitting layer 8 close to the hole transport layer 6, light is emitted only in a region of about five quantum dots or less in the thickness direction near an interface with the hole transport layer 6. Therefore, as long as the thickness of the light-emitting layer 8 near the hole transport layer 6 is five quantum dots or greater, even when the red pixel light-emitting layer 8R is formed in the green subpixel GP and the blue subpixel BP on the electron transport layer 10 side, light is not emitted from the red pixel light-emitting layer 8R, and light emission of the green subpixel GP and the blue subpixel BP is generally unproblematic.

Therefore, it is possible to provide the light-emitting element 2A capable of reducing the number of times of patterning of the light-emitting layer 8.

However, in the above, it is stated that the light emission is generally unproblematic. This is because problems may arise when the film thicknesses of each of the red pixel light-emitting layer 8R, the green pixel light-emitting layer 8G, and the blue pixel light-emitting layer 8B are thin. That is, while light is emitted at the interface between the light-emitting layer 8 and the hole transport layer 6, when the red pixel light-emitting layer 8R and the green pixel light-emitting layer 8G as well as the red pixel light-emitting layer 8R and the blue pixel light-emitting layer 8B are layered, for example, there is a risk that the luminescent colors will be mixed when the film thicknesses are thin. For example, when each film thickness is one layer of particles of the quantum dots QDR, QDG, and QDB, there is a risk that the colored light of the light-emitting layer 8 in which the red pixel light-emitting layer 8R and the green pixel light-emitting layer 8G are layered and the light-emitting layer 8 in which the red pixel light-emitting layer 8R and the blue pixel light-emitting layer 8B are layered will be mixed. In this regard, preferably there are five or more layers of the quantum dots QDR, QDG, and QDB, for example. Alternatively, preferably the film thickness of each of the red pixel light-emitting layer 8R, the green pixel light-emitting layer 8G, and the blue pixel light-emitting layer 8B is 7.5 nm or greater, for example. Accordingly, the mixing of luminescent colors can be prevented.

Further, in FIG. 1, it is intended that the red pixel light-emitting layer 8R has the same thickness across the subpixel in its entirety, but the thickness is not necessarily limited thereto, and the red pixel light-emitting layer 8R may be thinner above the green pixel light-emitting layer 8G and the blue pixel light-emitting layer 8B than in the red subpixel RP. For example, a film thickness t8Rr of the red pixel light-emitting layer 8R of the red subpixel RP may be greater than a film thickness t8Rg of the red pixel light-emitting layer 8R of the green subpixel GP, which is equal to a film thickness t8Rb of the red pixel light-emitting layer 8R of the blue subpixel BP.

That is, when a film is applied and formed on an underlayer including a step, the film is thin where the step is high compared to that where the step is low. That is, the film thickness of a light-emitting layer formed on a patterned light-emitting layer differs depending on the pixel, and the film may be thinner in the pixel in which light-emitting layers are layered. By making the film thinner, it is possible to suppress a rise in voltage due to an increase in film thickness.

Here, in the light-emitting element 2A of the present embodiment, as illustrated in (a), (b), (c), and (d) of FIG. 2, the electron affinity increases in the order of the electron transport layer 10, the red pixel light-emitting layer 8R, the green pixel light-emitting layer 8G, and the blue pixel light-emitting layer 8B.

Electron transport efficiencies between the electron transport layer 10 and the red pixel light-emitting layer 8R, the green pixel light-emitting layer 8G, and the blue pixel light-emitting layer 8B are dependent on a difference in electron affinity, that is, a size of an electron injection barrier, between the red pixel light-emitting layer 8R, the green pixel light-emitting layer 8G, and the blue pixel light-emitting layer 8B with respect to the electron transport layer 10, respectively, and the electron transport efficiency decreases when the electron injection barrier increases.

Specifically, the valence band level (V.B.: equivalent to ionization potential) of the II-VI group-based semiconductor quantum dots has a small change in light emission wavelength (luminescent color), but the conduction band level (C.B.: equivalent to electron affinity) greatly changes in light emission wavelength (luminescent color). As a result, although the electron injection barrier from the electron transport layer 10 to the red pixel light-emitting layer 8R is small as illustrated in (a) of FIG. 3, the electron injection barrier from the electron transport layer 10 to the blue pixel light-emitting layer 8B is large as illustrated in (b) of FIG. 3. Therefore, the luminous efficiency of the blue pixel light-emitting layer 8B is worse than the luminous efficiency of the red pixel light-emitting layer 8R.

In contrast, in the light-emitting element 2A of the present embodiment, the red pixel light-emitting layer 8R and the other green pixel light-emitting layer 8G or blue pixel light-emitting layer 8B are layered. As a result, as illustrated in (c) of FIG. 3, with the red pixel light-emitting layer 8R inserted between the blue pixel light-emitting layer 8B and the electron transport layer 10, the barrier of electron affinity between the electron transport layer 10 and the blue pixel light-emitting layer 8B is small, and the electron injection efficiency is increased.

Here, in the light-emitting layer in the related art in which the red quantum dot light-emitting layer, the green quantum dot light-emitting layer, and the blue quantum dot light-emitting layer are provided, when the electron affinity is made to increase in the order of the electron transport layer, the red quantum dot light-emitting layer, the green quantum dot light-emitting layer, and the blue quantum dot light-emitting layer, the electron transport efficiency from the electron transport layer to the blue quantum dot light-emitting layer is the worst. This is because the difference between the electron affinities of the electron transport layer and the blue quantum dot light-emitting layer is the largest, and thus the electron transfer energy is the largest.

In this regard, in the present embodiment, the red pixel light-emitting layer 8R directly faces the electron transport layer 10 across the entire surface of the light-emitting layer 8, and thus, in the green pixel light-emitting layer 8G and the blue pixel light-emitting layer 8B, the electrons e⁻ move to the green pixel light-emitting layer 8G and the blue pixel light-emitting layer 8B via the red pixel light-emitting layer 8R having the smallest electron transfer energy. This means that, because the electrons move stepwise through the red pixel light-emitting layer 8R having a small electron affinity difference even with respect to the green pixel light-emitting layer 8G and the blue pixel light-emitting layer 8B, the electron transport efficiency can be improved. Further, the electron affinity difference between the blue pixel light-emitting layer 8B and the hole transport layer 6 is large compared to the electron affinity difference between the electron transport layer 10 and the red pixel light-emitting layer 8R or the red pixel light-emitting layer 8R and the blue pixel light-emitting layer 8B. As a result, an effect of blocking the electrons e⁻ at the interface of the hole transport layer 6 can be kept high.

Figure 4:
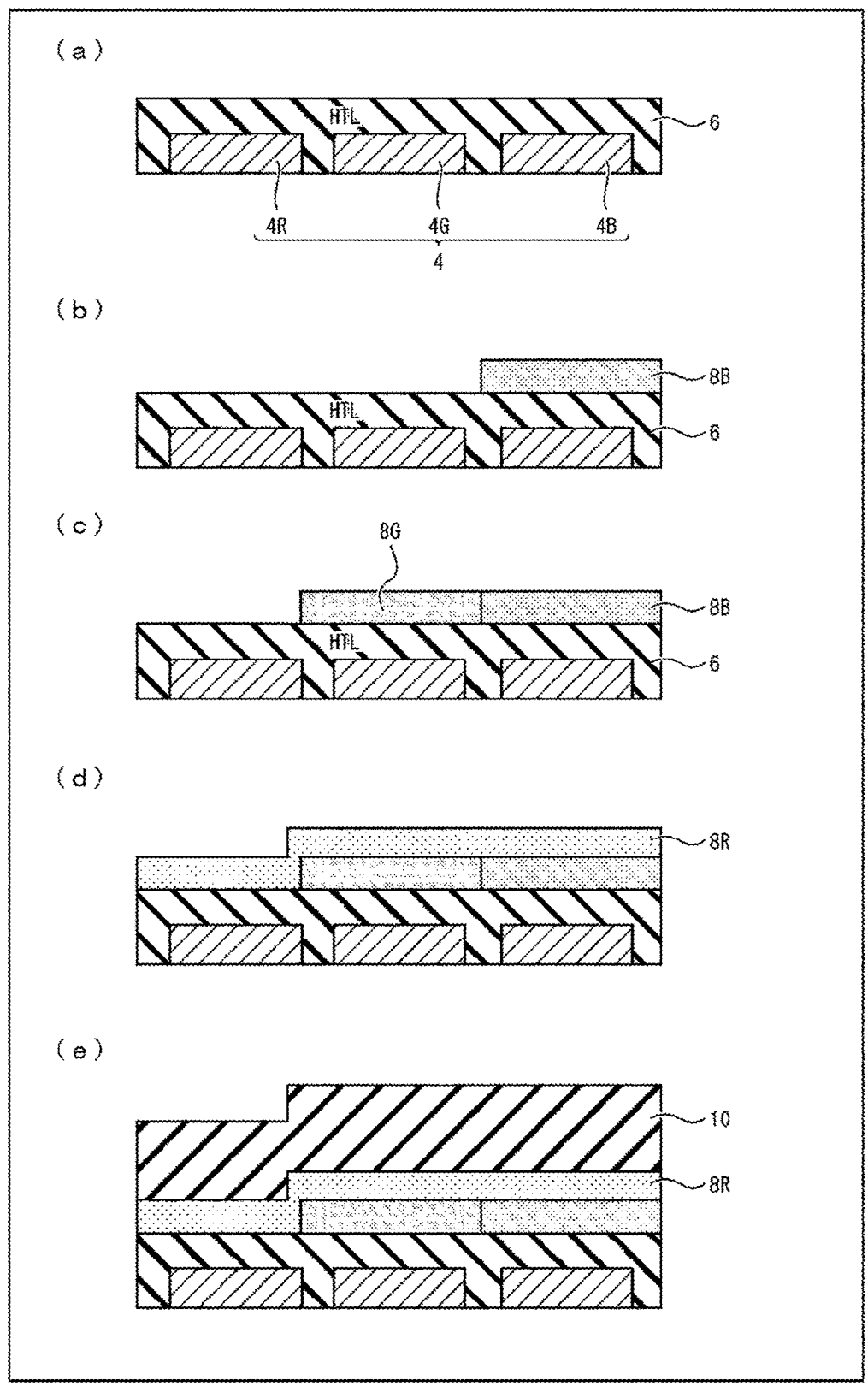
FIGS. 4(a) to 4(e) are cross-sectional views illustrating each step of a manufacturing method of a light-emitting element according to the present embodiment.
Figure 5:
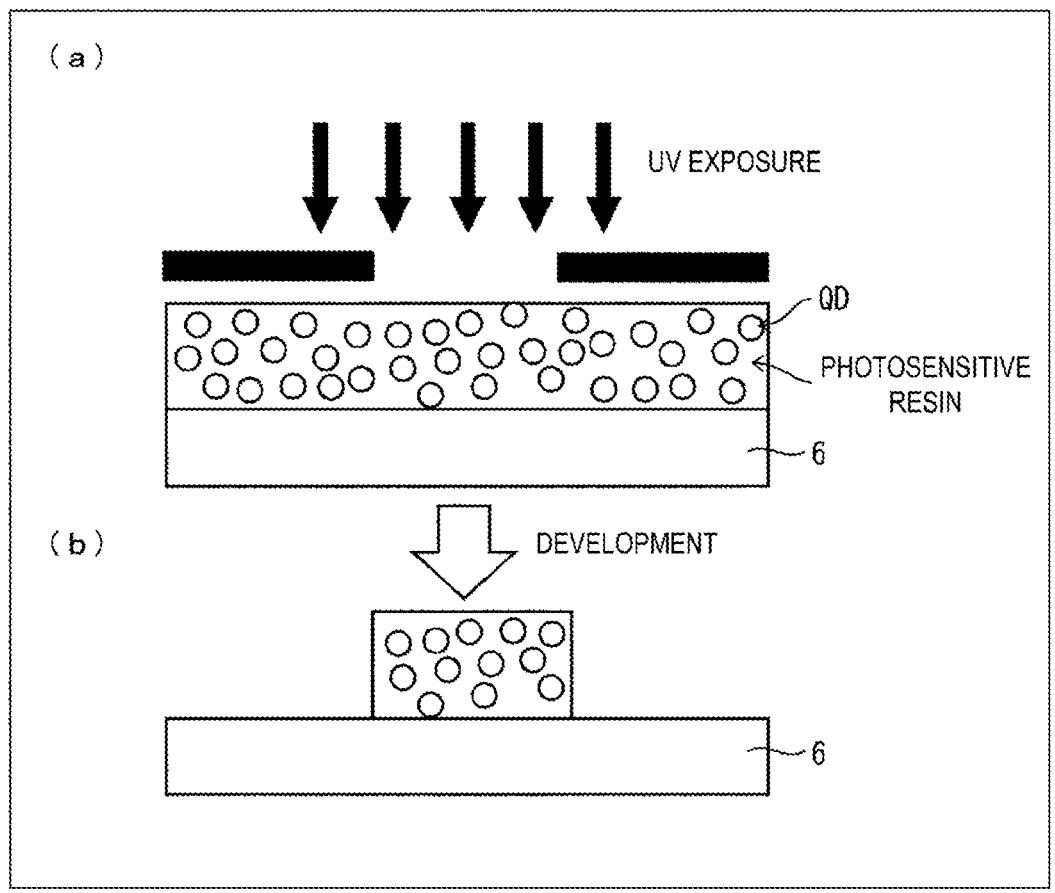
FIGS. 5(a) and 5(b) are cross-sectional views illustrating a method of forming quantum dot light-emitting layers of each color in the manufacturing method of a light-emitting element according to the present embodiment.

A manufacturing method of the light-emitting element 2A having the above-described configuration will be described on the basis of (a) to (e) of FIG. 4 and (a) and (b) of FIG. 5. (a) to (e) of FIG. 4 are cross-sectional views illustrating each step of the manufacturing method of the light-emitting element 2A according to the present embodiment. (a) and (b) of FIG. 5 are cross-sectional views illustrating a method of forming one of the red pixel light-emitting layer 8R, the green pixel light-emitting layer 8G, and the blue pixel light-emitting layer 8B of the manufacturing method of a light-emitting element according to the present embodiment.

When the light-emitting element 2A of the present embodiment is manufactured, as illustrated in (a) of FIG. 4, the hole transport layer 6 is formed without patterning on the anode electrode 4, which is a pixel electrode electrically connected to an array substrate (not illustrated), by application, vapor deposition, or the like. Next, as illustrated in (b) of FIG. 4, the blue pixel light-emitting layer 8B is formed only on the blue subpixel BP. The formation method is, for example, photolithography, ink-jet, electrodeposition, lift-off, or transfer. Here, when formation is by photolithography, for example, a QD resist, which is a photosensitive resin containing the blue quantum dots QDB, is applied to the hole transport layer 6, as illustrated in (a) of FIG. 5. A thickness of the QD resist is, for example, from 20 to 100 nm. Next, the QD resist is prebaked. Specifically, the solvent is evaporated at 80 to 120° C., and the coating film is dried. Next, the dried QD resist is UV exposed. In the UV exposure, irradiation energy from 10 to 1000 mJ/cm², for example, is used to execute exposure through a mask. Next, as illustrated in (b) of FIG. 5, development is performed using an alkaline solution, an organic solvent, or water. Here, in the case of a positive-working resist, the UV irradiated portion is dissolved. On the other hand, in the case of a negative-working resist, the UV non-irradiated portion is dissolved.

Lastly, actual baking is performed at 100 to 200° C. Note that, when the actual baking is performed, gas release during the QLED element action from the UV photosensitive resin is suppressed, as necessary.

The blue pixel light-emitting layer 8B, for example, formed in this way contains the blue quantum dots QDB, a ligand, and the photosensitive resin. Note that, in the drive voltage, the conductivity of the photosensitive resin is low.

Next, as illustrated in (c) of FIG. 4, the green pixel light-emitting layer 8G is formed only on the green subpixel GP. For the formation method, similar to the blue pixel light-emitting layer 8B, photolithography, ink-jet, electrodeposition, lift-off, or transfer, for example, can be performed.

Next, as illustrated in (d) of FIG. 4, the red pixel light-emitting layer 8R is formed without patterning on the entire pixel. The formation method is, for example, application of a colloidal solution. When formation is by application, the film thickness of the red pixel light-emitting layer 8R on the green subpixel GP and the blue subpixel BP can be formed thinner than the film thickness of the red pixel light-emitting layer 8R on the red subpixel RP and, as a result, the film thickness of the light-emitting layer 8 of the green subpixel GP and the blue subpixel BP can be thinned. Accordingly, it is possible to suppress a rise in the drive voltage.

Next, as illustrated in (e) of FIG. 4, the electron transport layer 10 is formed without patterning on the entire pixel. The formation method is, for example, application or vapor deposition.

Lastly, although not illustrated, the cathode electrode 12, which is a common electrode, is formed without patterning on the electron transport layer 10. The formation method is, for example, application or vapor deposition.

The light-emitting element 2A can be formed by the series of steps described above to complete the light-emitting device 1A.

Note that there are light-emitting elements having a normal structure such as in the present embodiment and light-emitting elements having an invert structure illustrated in third and fourth embodiments described later. When the light-emitting element of the normal structure and the light-emitting element of the invert structure are compared, in the normal structure, the first patterned layer is damaged once in the patterning step (development step or the like) of the next patterned layer, but the second patterned layer and the final solid film are not damaged by additional patterning. On the other hand, in the invert structure, the first solid film is damaged by two patterning steps, the film of the second layer is damaged by one patterning, and only the third layer is not damaged by patterning. As a result, with a normal structure, the light-emitting layer 8 is considered to have little damage compared to that with the invert structure.

Figure 6:
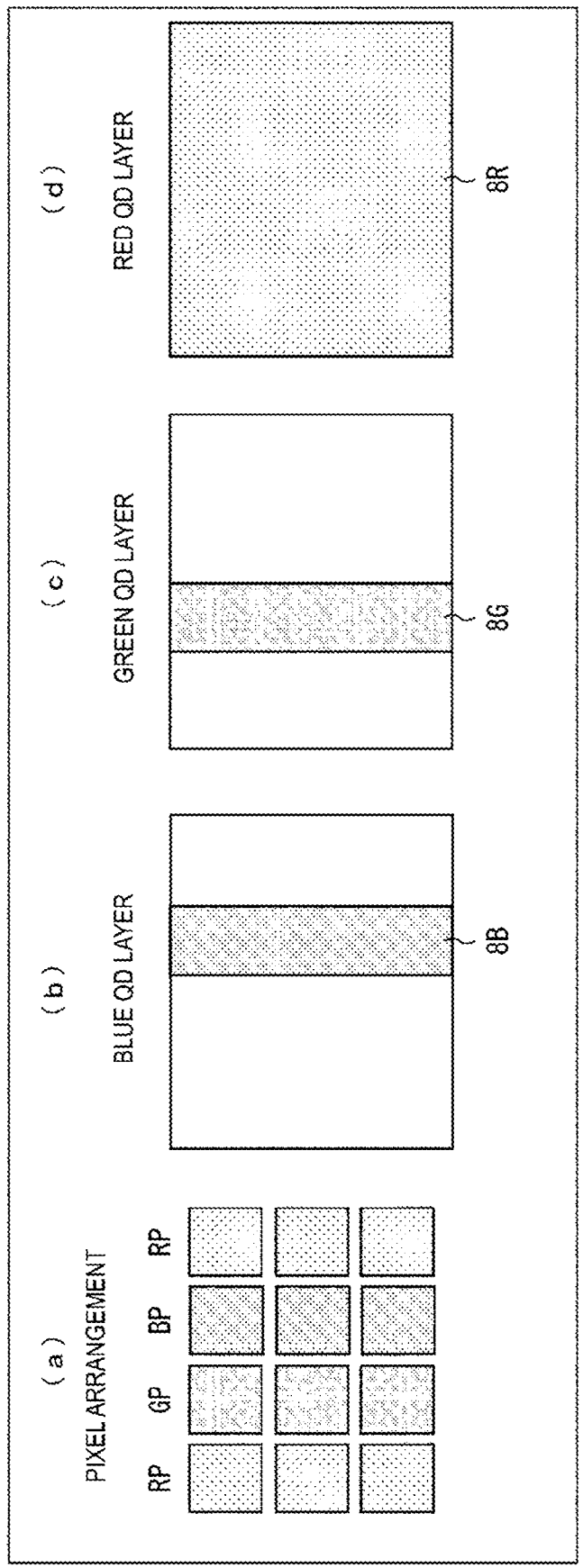
FIG. 6(a) is a plan view illustrating a formation method of quantum dot light-emitting layers of each color in a simple stripe pixel arrangement of a first embodiment and illustrates a pixel arrangement of one example.
FIG. 6(b) is a plan view illustrating a formation pattern of a blue quantum dot light-emitting layer for obtaining the pixel arrangement of FIG. 6(a)
FIG. 6(c) is a plan view illustrating a formation pattern of a green quantum dot light-emitting layer for obtaining the pixel arrangement of FIG. 6(a)
FIG. 6(d) is a plan view illustrating a formation pattern of a red quantum dot light-emitting layer for obtaining the pixel arrangement of FIG. 6(a).
Figure 7:
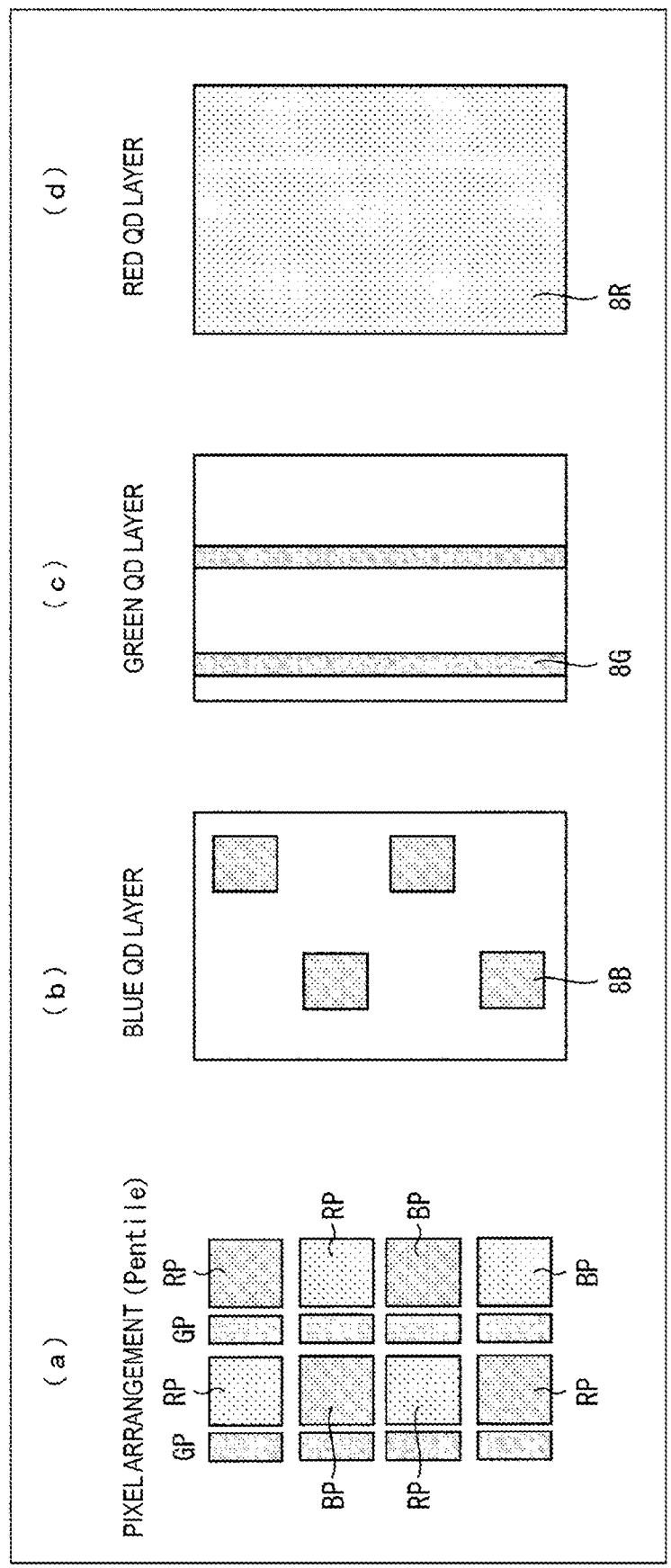
FIG. 7(a) is a plan view illustrating a formation method of the quantum dot light-emitting layers of each color in a simple stripe pixel arrangement of the first embodiment and illustrates a pixel arrangement of one example.
FIG. 7(b) is a plan view illustrating a formation pattern of the blue quantum dot light-emitting layer for obtaining the pixel arrangement of FIG. 7(a)
FIG. 7(c) is a plan view illustrating a formation pattern of the green quantum dot light-emitting layer for obtaining the pixel arrangement of FIG. 7(a)
FIG. 7(d) is a plan view illustrating a formation pattern of the red quantum dot light-emitting layer for obtaining the pixel arrangement of FIG. 7(a).
Figure 8:
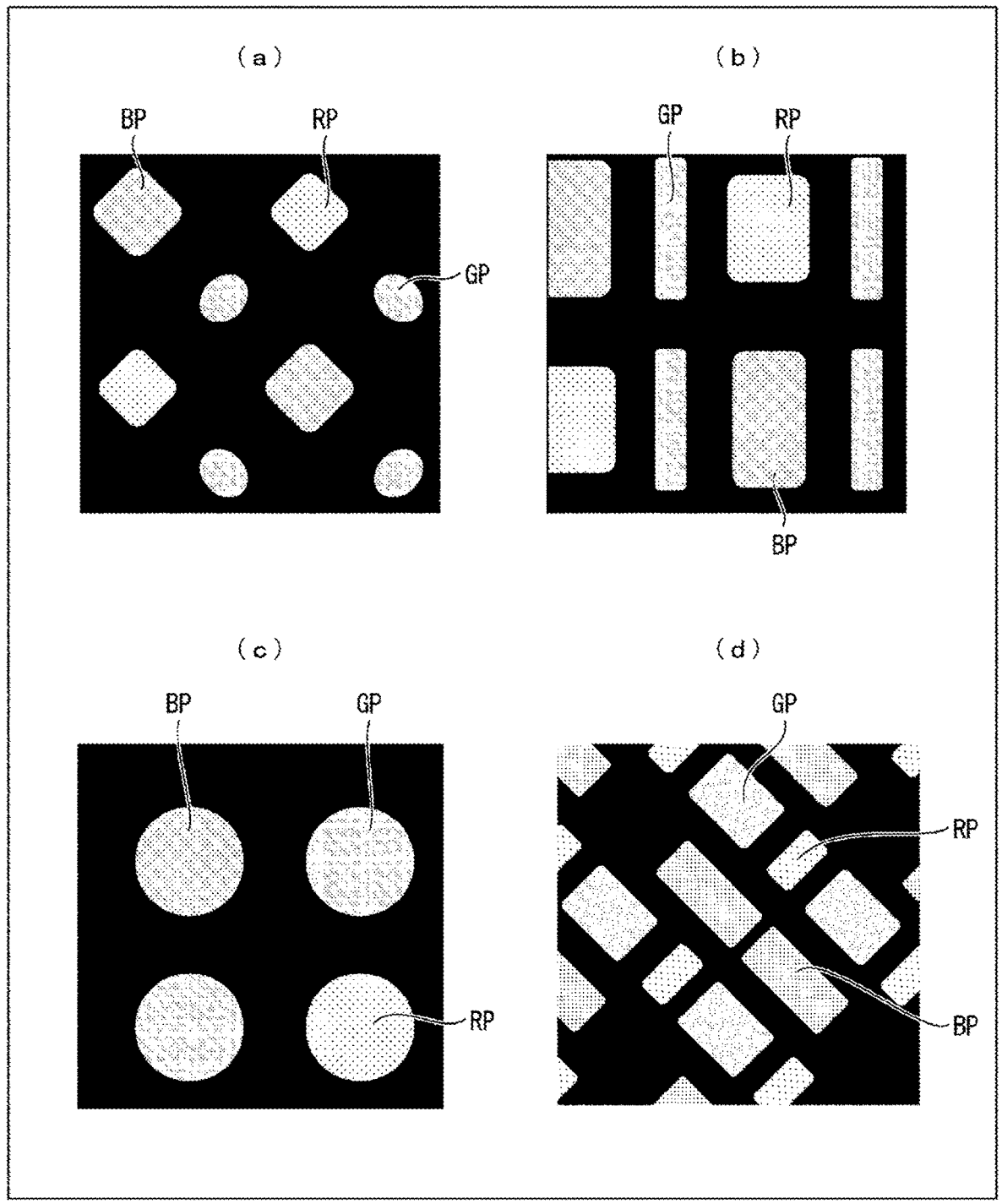
FIGS. 8(a) to 8(d) are plan views illustrating various other pixel arrangements different from those described above.

Here, an example of a pixel arrangement of the red subpixel RP, the green subpixel GP, and the blue subpixel BP will be described with reference to (a), (b), (c), and (d) of FIG. 6 to (a), (b), (c), and (d) of FIG. 8. (a), (b), (c), and (d) of FIG. 6 are plan views illustrating a simple stripe pixel arrangement of the present embodiment and a formation method of the quantum dot light-emitting layers of each color. (a), (b), (c), and (d) of FIG. 7 are plan views illustrating a pixel arrangement other than the simple stripe pixel arrangement of the present embodiment and a formation method of the quantum dot light-emitting layers of each color. (a), (b), (c), and (d) of FIG. 8 are plan views illustrating various other pixel arrangements different from those described above.

As a simple stripe pixel arrangement of the red subpixel RP, the green subpixel GP, and the blue subpixel BP, the red subpixel RP, the green subpixel GP, and the blue subpixel BP can be aligned in each column sequentially from the left, for example, as illustrated in (a) of FIG. 6. In this simple stripe pixel arrangement, the pattern shapes in one pixel of the red pixel light-emitting layer 8R, the green pixel light-emitting layer 8G, and the blue pixel light-emitting layer 8B have the same periodic arrangement.

In the case of this arrangement, in the light-emitting layer 8, as illustrated in (b), (c), (d) of FIG. 6, for example, the blue pixel light-emitting layer 8B can be patterned and formed first, then the green pixel light-emitting layer 8G can be patterned and formed adjacent to the blue pixel light-emitting layer 8B, and lastly the red pixel light-emitting layer 8R can be formed without patterning across the entire surface of the pixel.

Further, as a pixel arrangement other than the simple stripe pixel arrangement, as illustrated in (a) of FIG. 7, the red pixel light-emitting layer 8R and the blue pixel light-emitting layer 8B can be alternately arrayed in a vertical direction next to a column of the green pixel light-emitting layer 8G having a long and narrow shape, the column of the green pixel light-emitting layer 8G having a long and narrow shape can be arrayed again next to those columns, and the blue pixel light-emitting layer 8B and the red pixel light-emitting layer 8R can be further alternately arrayed in the vertical direction next to that column, for example. In this pixel arrangement other than the simple stripe pixel arrangement, the pattern shapes in one pixel of the red pixel light-emitting layer 8R, the green pixel light-emitting layer 8G, and the blue pixel light-emitting layer 8B have different periodic arrangements.

In the case of this arrangement, in the light-emitting layer 8, as illustrated in (b), (c), (d) of FIG. 7, for example, the blue pixel light-emitting layer 8B can be patterned and formed first, then the green pixel light-emitting layer 8G can be patterned and formed, and lastly the red pixel light-emitting layer 8R can be formed without patterning across the entire surface of the pixel.

Note that examples of other arrangements of the pixel include those illustrated in (a), (b), (c), and (d) of FIG. 8.

Thus, the light-emitting element 2A of the present embodiment includes the red pixel anode electrode 4R, the green pixel anode electrode 4G, and the blue pixel anode electrode 4B as the pixel electrodes provided for individual subpixels of at least three colors, the cathode electrode 12 as the common electrode provided facing the red pixel anode electrode 4R, the green pixel anode electrode 4G, and the blue pixel anode electrode 4B, and the red pixel light-emitting layer 8R, the green pixel light-emitting layer 8G, and the blue pixel light-emitting layer 8B as the light-emitting layers of each color provided between the cathode electrode 12 and, respectively, the red pixel anode electrode 4R, the green pixel anode electrode 4G, and the blue pixel anode electrode 4B. The red pixel light-emitting layer 8R of the color having the largest electron affinity among the red pixel light-emitting layer 8R, the green pixel light-emitting layer 8G, and the blue pixel light-emitting layer 8B of the at least three colors extends in a state of being layered between the cathode electrode 12 and the green pixel light-emitting layer 8G and the blue pixel light-emitting layer 8B of the other colors as well.

Thus, it is possible to provide the light-emitting element 2A capable of reducing the number of times of patterning of the red pixel light-emitting layer 8R.

Further, in the light-emitting element 2A according to the present embodiment, the subpixels of the at least three colors are the red subpixel RP, the green subpixel GP, and the blue subpixel BP. As a result, the red pixel light-emitting layer 8R having the largest electron affinity extends in a state of being layered on the green pixel light-emitting layer 8G and the blue pixel light-emitting layer 8B.

Accordingly, the red pixel light-emitting layer 8R having the largest electron affinity among the red pixel light-emitting layer 8R, the green pixel light-emitting layer 8G, and the blue pixel light-emitting layer 8B of the at least three colors does not require a patterning step, and thus it is sufficient to perform the entire patterning step twice for the green pixel light-emitting layer 8G and the blue pixel light-emitting layer 8B. Therefore, an increase in the length of the process steps can be suppressed and the cost associated with the pattern mask can be reduced.

Further, in the present embodiment, in the green subpixel GP and the blue subpixel BP, the red pixel light-emitting layer 8R having the lowest energy of the conduction band level (C.B.: equivalent to electron affinity) is provided between the cathode electrode 12 and the anode electrodes of the other colors. As a result, an energy gap of the conduction band level (C.B.: equivalent to electron affinity) at the interface between the electron transport layer 10 and the red pixel light-emitting layer 8R becomes smaller than energy gaps of the conduction band level (C.B.: equivalent to electron affinity) at the interface between the electron transport layer 10 and the green pixel light-emitting layer 8G and the interface between the electron transport layer 10 and the blue pixel light-emitting layer 8B. Therefore, it is possible to improve the injection efficiency of the electrons $e^-$.

Further, in the light-emitting element 2A according to the present embodiment, the electron affinity increases in the order of the electron transport layer 10, the red pixel light-emitting layer 8R, the green pixel light-emitting layer 8G, and the blue pixel light-emitting layer 8B. As a result, the electrons move stepwise through the light-emitting layer having a small electron affinity difference, and thus the electron transport efficiency can be improved.

Further, in the light-emitting element 2A according to the present embodiment, the red pixel light-emitting layer 8R, the green pixel light-emitting layer 8G, and the blue pixel light-emitting layer 8B each include quantum dot particles and, in the layered red pixel light-emitting layer 8R and the green pixel light-emitting layer 8G and the layered red pixel light-emitting layer 8R and the blue pixel light-emitting layer 8B, the particle size of the quantum dot particles included in the red pixel light-emitting layer 8R positioned closer to the cathode electrode 12 than the anode electrode 4 is long.

That is, the light-emitting layer including quantum dot particles of a large particle size emits a long wavelength compared to that of a light-emitting layer including quantum dot particles of a small particle size. Thus, when the light-emitting layers of each color are layered, the red pixel light-emitting layer 8R emitting the longest wavelength among the red pixel light-emitting layer 8R, the green pixel light-emitting layer 8G, and the blue pixel light-emitting layer 8B is positioned closer to the cathode electrode 12.

Further, in the light-emitting element 2A according to the present embodiment, the light-emitting layer closest to the anode electrode 4 includes five or more layers of quantum dot particles.

That is, the red pixel light-emitting layer 8R, the green pixel light-emitting layer 8G, and the blue pixel light-emitting layer 8B emit colors corresponding to the red pixel light-emitting layer 8R, the green pixel light-emitting layer 8G, and the blue pixel light-emitting layer 8B at the interface between the hole transport layer 6 and, respectively, the red pixel light-emitting layer 8R, the green pixel light-emitting layer 8G, and the blue pixel light-emitting layer 8B. Here, when the red pixel light-emitting layer 8R, the green pixel light-emitting layer 8G, and the blue pixel light-emitting layer 8B are thin, that is, when the quantum dot particles constitute less than five layers, the red pixel light-emitting layer 8R on the side closer to the layered cathode electrode 12 also exists near the interface with the hole transport layer 6, and thus there is a risk that the red pixel light-emitting layer 8R on the side closer to the layered cathode electrode 12 will also emit light. As a result, color mixing can occur due to the light emission of the green pixel light-emitting layer 8G or the blue pixel light-emitting layer 8B closest to the hole transport layer 6 and the light emission of the red pixel light-emitting layer 8R on the side closer to the laminated cathode electrode 12.

In contrast, in the present embodiment, the light-emitting layer closest to the anode electrode 4 includes five or more layers of quantum dot particles. Specifically, the red pixel light-emitting layer 8R, the green pixel light-emitting layer 8G, and the blue pixel light-emitting layer 8B that come into contact with the hole transport layer 6 include five or more layers of quantum dot particles. Therefore, even when the red pixel light-emitting layer 8R is layered on the green pixel light-emitting layer 8G and the blue pixel light-emitting layer 8B, color mixing is unlikely to occur.

Further, in the light-emitting element 2A according to the present embodiment, the red pixel light-emitting layer 8R, which is the light-emitting layer 8 formed on the patterned green pixel light-emitting layer 8G and blue pixel light-emitting layer 8B, differs in film thickness for each of the red subpixel RP, the green subpixel GP, and the blue subpixel BP. Specifically, the film thickness of the red pixel light-emitting layer 8R of the upper layer in the green subpixel GP and the blue subpixel BP in which the light-emitting layer 8 is layered is thinner than the film thickness of the red pixel light-emitting layer 8R in the red subpixel RP in which the light-emitting layer 8 is not layered.

As described above, the red pixel light-emitting layer 8R of the green subpixel GP and the blue subpixel BP is thinner than the red pixel light-emitting layer 8R of the red subpixel RP, making it possible to suppress a rise in voltage due to the increase in film thickness.

Further, in the light-emitting element 2A according to the present embodiment, the red pixel anode electrode 4R, the green pixel anode electrode 4G, and the blue pixel anode electrode 4B serving as the anode electrode 4, the red pixel light-emitting layer 8R, the green pixel light-emitting layer 8G, the blue pixel light-emitting layer 8B, and the common electrode of the cathode electrode 12 are layered in this order. Further, in the blue subpixel BP, the light-emitting layer 8 is layered in the order of the blue pixel light-emitting layer 8B, the green pixel light-emitting layer 8G, and the red pixel light-emitting layer 8R, which is an order of ascending electron affinity.

Thus, in the light-emitting element 2A having the so-called normal structure, it is possible to provide the light-emitting element 2A capable of reducing the number of times of patterning of the red pixel light-emitting layer 8R.

Further, in the light-emitting element 2A according to the present embodiment, the differences in electron affinity between the hole transport layer 6 and the red pixel light-emitting layer 8R, the green pixel light-emitting layer 8G, and the blue pixel light-emitting layer 8B, which are the light-emitting layers in contact with the hole transport layer 6, are greater than a difference in electric affinity between, for example, the red pixel light-emitting layer 8R and the green pixel light-emitting element 8G or, for example, the red pixel light-emitting layer 8R and the blue pixel light-emitting layer 8B, which are the layered light-emitting layers. Thus, the effect of blocking the electrons $e^-$ at the interface of the hole transport layer 6 can be kept high.

Further, in the light-emitting element 2A according to the present embodiment, a charge transport stopper layer (not illustrated) having a band gap greater than those of the red pixel light-emitting layer 8R, the green pixel light-emitting layer 8G, the blue pixel light-emitting layer 8B can be provided between the electron transport layer 10 and the red pixel light-emitting layer 8R, the green pixel light-emitting layer 8G, and the blue pixel light-emitting layer 8B.

Thus, it is possible to prevent the electrons $e^-$ that have reached the light-emitting layer 8 from the cathode electrode 12 via the electron transport layer 10 from being further discharged to the hole transport layer 6 without emitting light. Further, it is possible to prevent the positive holes $h^+$ that have reached the light-emitting layer 8 from the anode electrode 4 via the hole transport layer 6 from being further discharged to the electron transport layer 10 without emitting light.

Further, the light-emitting element 2A according to the present embodiment can include a photosensitive resin in the red pixel light-emitting layer 8R, the green pixel light-emitting layer 8G, and the blue pixel light-emitting layer 8B.

Thus, in the patterning step of the red pixel light-emitting layer 8R, the green pixel light-emitting layer 8G, and the blue pixel light-emitting layer 8B, the green pixel light-emitting layer 8G and blue pixel light-emitting layer 8B can be patterned and formed by exposure and development.

Further, in the light-emitting element 2A according to the present embodiment, planar shapes of the red pixel light-emitting layer 8R, the green pixel light-emitting layer 8G, and the blue pixel light-emitting layer 8B differ depending on each color, as illustrated in (a), (b), (c), and (d) of FIG. 8. Thus, subpixels of various patterns can be formed.

Further, in the light-emitting element 2A according to the present embodiment, an electron injection layer serving as a charge injection layer (not illustrated) can be provided between the light-emitting layer 8 and the cathode electrode 12, or between the electron transport layer 10 and the cathode electrode 12 serving as a common electrode joined to the electron transport layer 10. Thus, transport of the electrons e⁻ between the cathode electrode 12 and the electron transport layer 10 is performed via the electron injection layer. As a result, the electron transport efficiency between the cathode electrode 12 and the electron transport layer 10 can be improved.

Further, in the light-emitting element 2A according to the present embodiment, a hole injection layer serving as a charge injection layer (not illustrated) can be provided between the light-emitting layer 8 and the anode electrode 4 or between the hole transport layer 6 and the anode electrode 4. Thus, transport of the positive holes h⁺ between the anode electrode 4 and the hole transport layer 6 is performed via the hole injection layer. As a result, the hole transport efficiency between the anode electrode 4 and the hole transport layer 6 can be improved.

Further, in the light-emitting element 2A according to the present embodiment, the electron transport layer 10, the hole transport layer 6, the electron injection layer, and the hole injection layer are each formed of a common material regardless of the red pixel light-emitting layer 8R, the green pixel light-emitting layer 8G, and the blue pixel light-emitting layer 8B of the at least three colors.

As a result, in the subpixels of the three colors, transport of electrons between the electron transport layer and one of the subpixel electrode and the common electrode can be performed via the electron injection layer under the same conditions for the subpixels of the three colors.

Further, in the light-emitting element 2A according to the present embodiment, the edge cover 16 is provided between each of the red subpixel RP, the green subpixel GP, and the blue subpixel BP as an insulating layer partitioning each subpixel, and the red pixel light-emitting layer 8R of the color having the largest electron affinity among the red pixel light-emitting layer 8R, the green pixel light-emitting layer 8G, and the blue pixel light-emitting layer 8B of the three colors is formed between the edge cover 16 and the cathode electrode 12, serving as the common electrode, as well.

Thus, the red subpixel RP, the green subpixel GP, and the blue subpixel BP are reliably partitioned by the edge cover 16, and the red pixel light-emitting layer 8R having the largest electron affinity is formed regardless of the presence or absence of the edge cover 16. As a result, regardless of the presence or absence of the edge cover 16 partitioning the red subpixel RP, the green subpixel GP, and the blue subpixel BP, the red pixel light-emitting layer 8R of the color having the largest electron affinity can be formed between the pixel electrodes, and thus the formation step of the red subpixel PR is not hindered by the presence or absence of the edge cover 16.

Further, the light-emitting device 1A according to the present embodiment includes the light-emitting element 2A of the present embodiment. Thus, it is possible to provide the light-emitting device 1A including the light-emitting element 2A capable of reducing the number of times of patterning of the red subpixel RP, the green subpixel GP, and the blue subpixel BP.

Further, the manufacturing method of the light-emitting element 2A according to the present embodiment includes a cathode electrode and anode electrode formation step of forming a pixel electrode as the anode electrode 4 and a common electrode as the cathode electrode 12. Further, the manufacturing method includes an extension step of extending the red pixel light-emitting layer 8R of the color having the largest electron affinity among the red pixel light-emitting layer 8R, the green pixel light-emitting layer 8G, and the blue pixel light-emitting layer 8B of the at least three colors in a state of being layered between the cathode electrode 12 and the green pixel light-emitting layer 8G and the blue pixel light-emitting layer 8B of the other colors as well. That is, the manufacturing method includes an extension step of extending the red pixel light-emitting layer 8R of the color having the largest electron affinity among the red pixel light-emitting layer 8R, the green pixel light-emitting layer 8G, and the blue pixel light-emitting layer 8B of the three colors in a state of being layered between the cathode electrode 12 and the green pixel light-emitting layer 8G and the blue pixel light-emitting layer 8B of the other colors as well.

Thus, it is possible to provide the manufacturing method of the light-emitting element 2A capable of reducing the number of times of patterning of the light-emitting layer 8.

Note that, in the present embodiment, the subpixels are the red subpixel RP, the green subpixel GP, and the blue subpixel BP composed of three colors. However, in one aspect of the disclosure, the colors are not necessarily limited to three colors, and subpixels of other colors can be further added.

Second Embodiment

Figure 9:
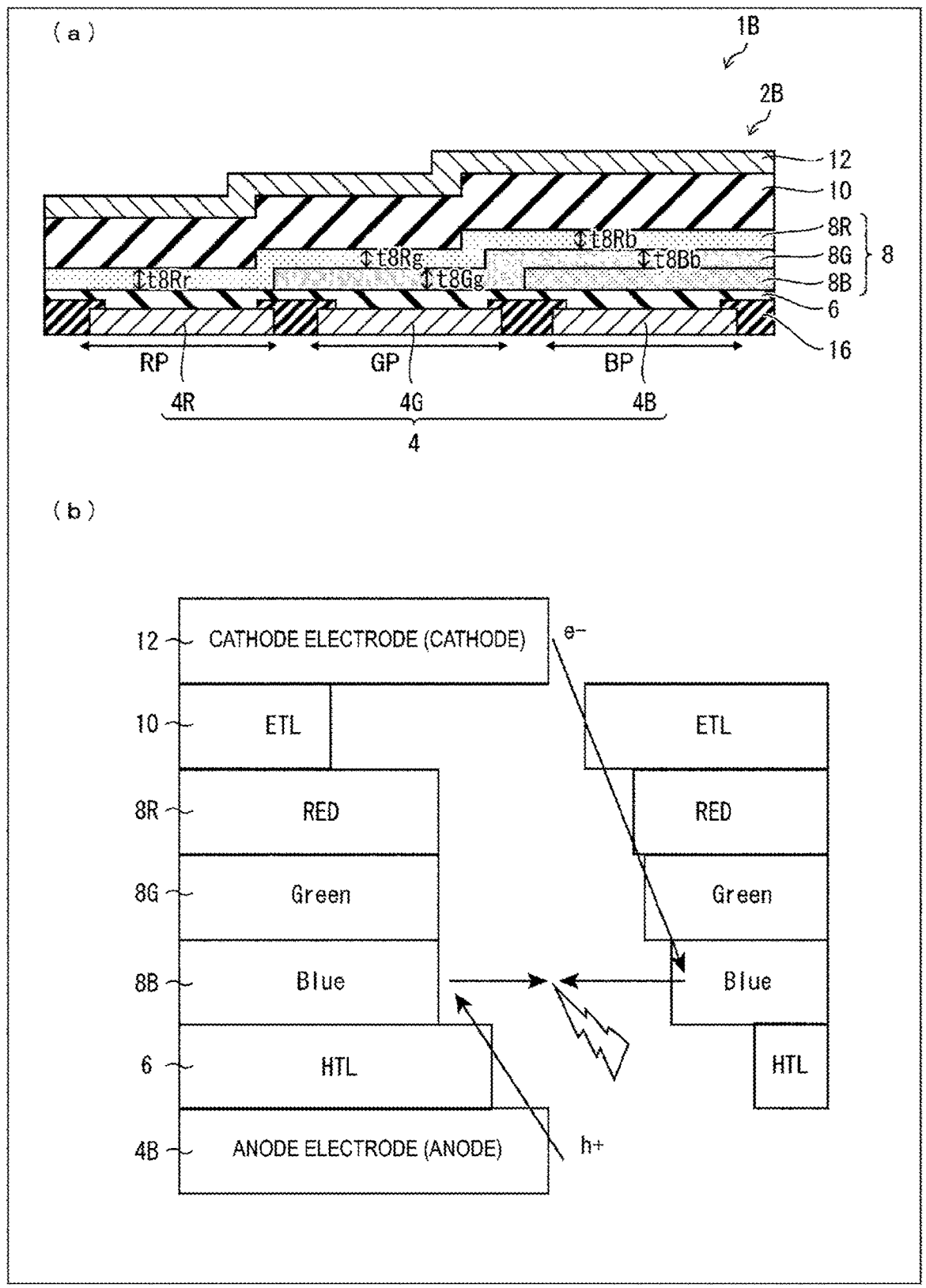
FIG. 9(a) is a cross-sectional view illustrating a configuration of a light-emitting device including the light-emitting element according to a second embodiment of the disclosure.
FIG. 9(b) is a cross-sectional view illustrating a luminous efficiency when the red quantum dot light-emitting layer, the green quantum dot light-emitting layer, and the blue quantum dot light-emitting layer are layered as light-emitting layers.
Figure 10:
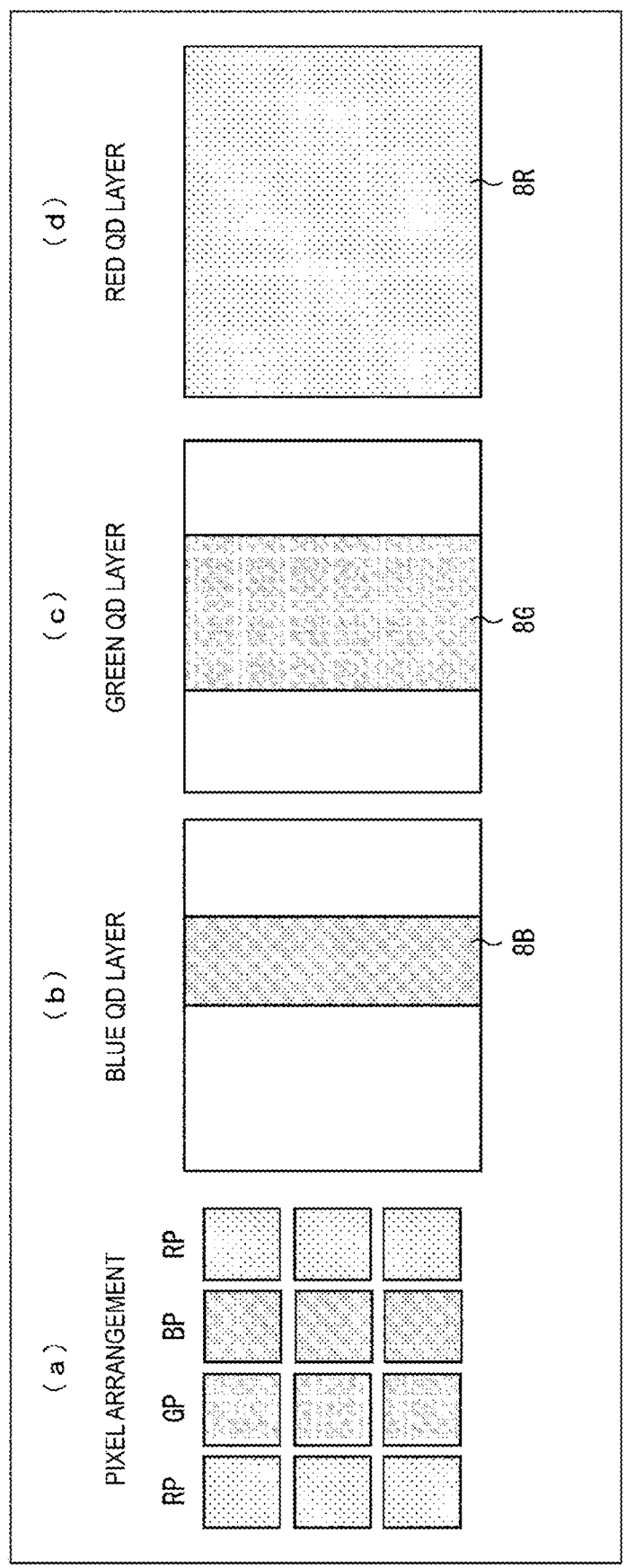
FIG. 10(a) is a plan view illustrating a formation method of the quantum dot light-emitting layers of each color in a simple stripe pixel arrangement of the second embodiment and illustrates a pixel arrangement of one example.
FIG. 10(b) is a plan view illustrating a formation pattern of the blue quantum dot light-emitting layer for obtaining the pixel arrangement of FIG. 10(a)
FIG. 10(c) is a plan view illustrating a formation pattern of the green quantum dot light-emitting layer for obtaining the pixel arrangement of FIG. 10(a)
FIG. 10(d) is a plan view illustrating a formation pattern of the red quantum dot light-emitting layer for obtaining the pixel arrangement of FIG. 10(a).
Figure 11:
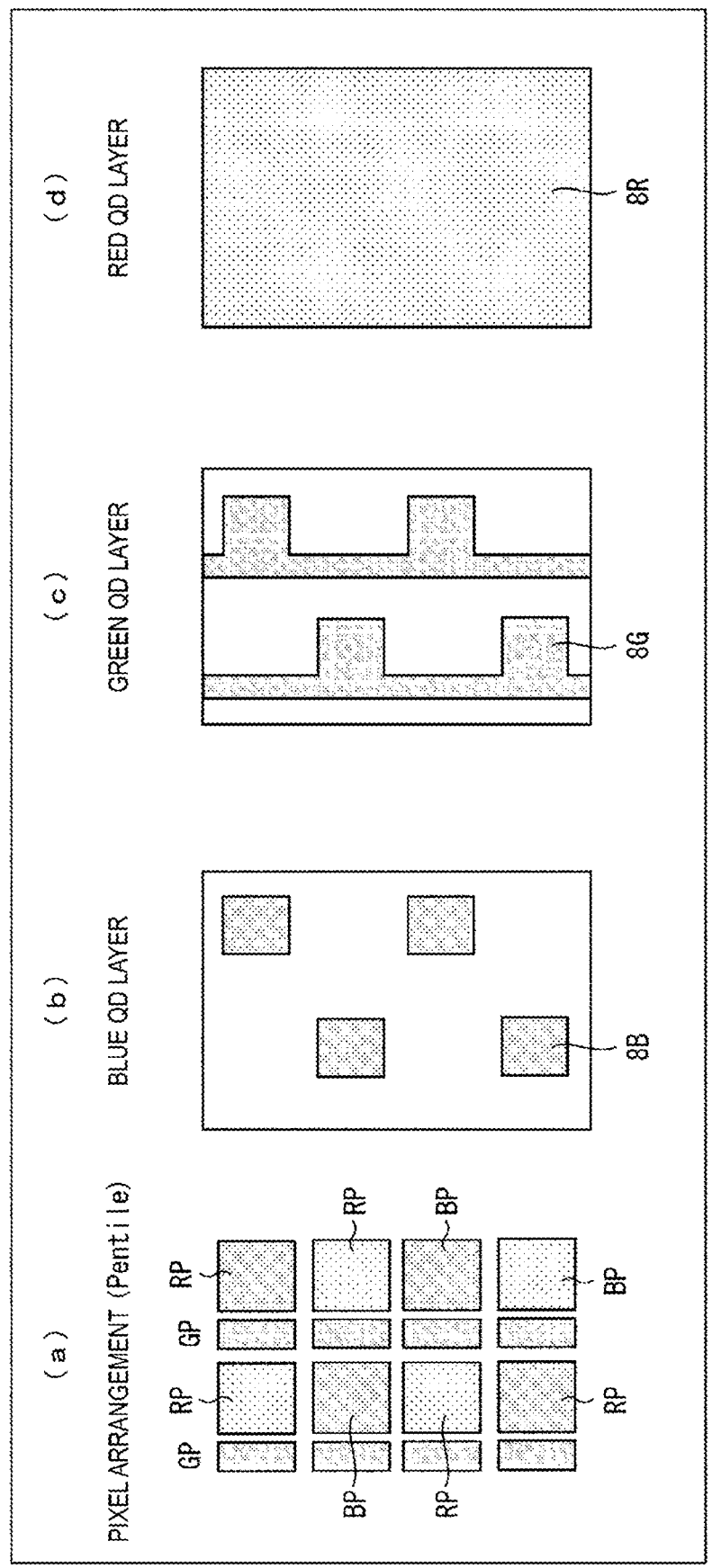
FIG. 11(a) is a plan view illustrating a formation method of the quantum dot light-emitting layers of each color in a simple stripe pixel arrangement of the second embodiment and illustrates a pixel arrangement of one example.
FIG. 11(b) is a plan view illustrating a formation pattern of the blue quantum dot light-emitting layer for obtaining the pixel arrangement of FIG. 11(a)
FIG. 11(c) is a plan view illustrating a formation pattern of the green quantum dot light-emitting layer for obtaining the pixel arrangement of FIG. 11(a)
FIG. 11(d) is a plan view illustrating a formation pattern of the red quantum dot light-emitting layer for obtaining the pixel arrangement of FIG. 11(a).

With reference to FIGS. 9 to 11, description is given below on another embodiment of the disclosure. Note that configurations other than those described in the present embodiment are the same as those of the first embodiment. For the sake of convenience of description, a member having the same function as the function of the member illustrated in the drawings of the first embodiment is denoted by the same reference sign, and description thereof is omitted.

In the light-emitting element 2A of the light-emitting device 1A according to the first embodiment, in the light-emitting layer 8, the green pixel light-emitting layer 8G and the blue pixel light-emitting layer 8B are patterned and arrayed side-by-side, and the red pixel light-emitting layer 8R is disposed across the entire pixel without being patterned. In contrast, a light-emitting element 2B of a light-emitting device 1B of the present embodiment differs in that only the blue pixel light-emitting layer 8B is patterned and arrayed and, in addition to the red pixel light-emitting layer 8R, the green pixel light-emitting layer 8G is also disposed without being patterned.

A configuration of the light-emitting element 2B of the light-emitting device 1B according to the present embodiment will be described with reference to (a) and (b) of FIG. 9. (a) of FIG. 9 is a cross-sectional view illustrating a configuration of the light-emitting device 1B including the light-emitting element 2B according to the present embodiment. (b) of FIG. 9 is a cross-sectional view illustrating a luminous efficiency when the red pixel light-emitting layer 8R, the green pixel light-emitting layer 8G, and the blue pixel light-emitting layer 8B are layered as the light-emitting layer 8.

As illustrated in (a) of FIG. 9, in the light-emitting element 2B of the light-emitting device 1B of the present embodiment, the green pixel light-emitting layer 8G of a color having a second largest electron affinity among the quantum dot light-emitting layers of the three colors extends in a state of being layered between the red pixel light-emitting layer 8R of the color having the largest electron affinity and the blue pixel light-emitting layer 8B of the remaining color as well.

Specifically, the cathode electrode 12 serving as the common electrode is commonly formed in the plurality of pixels.

Further, the red pixel light-emitting layer 8R of the light-emitting layer 8 is not patterned and covers a top of the anode electrode 4 of the entire pixel. The green pixel light-emitting layer 8G is patterned and covers tops of the green pixel anode electrode 4G and the blue pixel anode electrode 4B but does not cover a top of the red pixel anode electrode 4R. The blue pixel light-emitting layer 8B is patterned in a state of not covering the tops of the red pixel anode electrode 4R and the green pixel anode electrode 4G.

Although not illustrated in (a) of FIG. 9, the film thickness of the green pixel light-emitting layer 8G is different between on the green pixel anode electrode 4G and on the blue pixel anode electrode 4B, and the film thickness of the green pixel light-emitting layer 8G may be thicker than those on the green pixel anode electrode 4G and on the blue pixel anode electrode 4B. Specifically, a film thickness t8Gg of the green pixel light-emitting layer 8G on the green pixel anode electrode 4G may be greater than a film thickness t8Gb of the green pixel light-emitting layer 8G on the blue pixel anode electrode 4B.

Further, the film thickness of the red pixel light-emitting layer 8R is different on each of the pixel electrodes, the film thickness of the red pixel light-emitting layer 8R is thicker on the red pixel anode electrode 4R than on the green pixel anode electrode 4G and on the blue pixel anode electrode 4B, and further the film thickness of the red pixel light-emitting layer 8R may be thicker on the green pixel anode electrode 4G than on the blue pixel anode electrode 4B. Specifically, the film thickness t8Rr of the red pixel light-emitting layer 8R on the red subpixel anode electrode 4R may be greater than the film thickness t8Rg of the red pixel light-emitting layer 8R on the green subpixel anode electrode 4G, which is greater than the film thickness t8Rb of the red pixel light-emitting layer 8R on the blue subpixel anode electrode 4B.

The anode electrode 4 is divided for each red subpixel RP, green subpixel GP, and blue subpixel BP, and a voltage different from that of the adjacent subpixel can be applied to each.

The other configurations are similar to those of FIG. 1, and thus description thereof is omitted.

In the light-emitting element 2B having the configuration described above, the green pixel light-emitting layer 8G and the blue pixel light-emitting layer 8B, which are different from the red pixel light-emitting layer 8R of the color having the largest electron affinity among the quantum dot light-emitting elements of the at least three colors, are patterned. On the other hand, the red pixel light-emitting layer 8R of the color having the largest electron affinity among the quantum dot light-emitting layers of the three colors is not patterned and is formed on the entire surface of the light-emitting layer 8. Accordingly, the red pixel light-emitting layer 8R having the largest electron affinity among the quantum dot light-emitting layers of the three colors does not require a patterning step, and thus it is sufficient to perform the entire patterning step twice for the two colors of the green pixel light-emitting layer 8G and the blue pixel light-emitting layer 8B. Therefore, an increase in the length of the process steps can be suppressed and the cost associated with the pattern mask can be reduced.

In the light-emitting element 2B of the present embodiment, the electron affinity increases in the order of the electron transport layer 10, the red pixel light-emitting layer 8R, the green pixel light-emitting layer 8G, and the blue pixel light-emitting layer 8B.

Here, the electron transport efficiencies between the electron transport layer 10 and the red pixel light-emitting layer 8R, the green pixel light-emitting layer 8G, and the blue pixel light-emitting layer 8B are determined by a size of each electron affinity of the electron transport layer 10, the red pixel light-emitting layer 8R, the green pixel light-emitting layer 8G, and the blue pixel light-emitting layer 8B.

Specifically, the valence band level (V.B.: equivalent to ionization potential) of the II-VI semiconductor quantum dots has a small change in particle size (luminescent color), but the conduction band level (C.B.: equivalent to electron affinity) greatly changes in particle size (luminescent color). Here, in the light-emitting element 2B of the present embodiment, the red pixel light-emitting layer 8R, the green pixel light-emitting layer 8G, and the blue pixel light-emitting layer 8B are layered in three stages. As a result, as illustrated in (b) of FIG. 9, in the blue subpixel BP, the red pixel light-emitting layer 8R, which is the light-emitting layer having the largest electron affinity, is provided between the green pixel light-emitting layer 8G, which is the light-emitting layer having the second largest electron affinity, and the electron transport layer 10. Further, the red pixel light-emitting layer 8R and the green pixel light-emitting layer 8G are provided between the blue pixel light-emitting layer 8B having the smallest electron affinity and the electron transport layer 10. As a result, the barrier of electron affinity between the electron transport layer 10 and the blue pixel light-emitting layer 8B is small, and the electron injection efficiency is increased.

Here, an example of a pixel arrangement of the red subpixel RP, the green subpixel GP, and the blue subpixel BP of the present embodiment will be described with reference to (a), (b), (c), and (d) of FIG. 10 and (a), (b), (c), and (d) of FIG. 11. (a), (b), (c), and (d) of FIG. 10 are plan views illustrating a simple stripe pixel arrangement of the present embodiment and a formation method of the quantum dot light-emitting layers of each color. (a), (b), (c), and (d) of FIG. 11 are plan views illustrating a pixel arrangement other than the simple stripe pixel arrangement of the present embodiment and a formation method of the quantum dot light-emitting layers of each color.

As a simple stripe pixel arrangement of the red subpixel RP, the green subpixel GP, and the blue subpixel BP, the red subpixel RP, the green subpixel GP, and the blue subpixel BP can be aligned in each column sequentially from the left, for example, as illustrated in (a) of FIG. 10. In this simple stripe pixel arrangement, the pattern shapes in one pixel of the red pixel light-emitting layer 8R, the green pixel light-emitting layer 8G, and the blue pixel light-emitting layer 8B have the same periodic arrangement.

In the case of this arrangement, in the light-emitting layer 8, as illustrated in (b), (c), (d) of FIG. 10, for example, the blue pixel light-emitting layer 8B can be patterned and formed first, then the green pixel light-emitting layer 8G can be patterned and formed overlapping the blue pixel light-emitting layer 8B, and lastly the red pixel light-emitting layer 8R can be formed without patterning across the entire surface of the pixel.

Further, as a pixel arrangement other than the simple stripe pixel arrangement, as illustrated in (a) of FIG. 11, the red pixel light-emitting layer 8R and the blue pixel light-emitting layer 8B can be alternately arrayed in a vertical direction next to a column of the green pixel light-emitting layer 8G having a long and narrow shape, the column of the green pixel light-emitting layer 8G having a long and narrow shape can be arrayed again next to those columns, and the blue pixel light-emitting layer 8B and the red pixel light-emitting layer 8R can be further alternately arrayed in the vertical direction next to that column, for example. In this pixel arrangement other than the simple stripe pixel arrangement, the pattern shapes in one pixel of the red pixel light-emitting layer 8R, the green pixel light-emitting layer 8G, and the blue pixel light-emitting layer 8B have different periodic arrangements.

In the case of this arrangement, in the light-emitting layer 8, as illustrated in (b), (c), (d) of FIG. 11, for example, the blue pixel light-emitting layer 8B can be patterned and formed first, then the green pixel light-emitting layer 8G can be patterned and formed in a region of the green pixel light-emitting layer 8G and a region of the blue pixel light-emitting layer 8B, and lastly the red pixel light-emitting layer 8R can be formed without patterning across the entire surface of the pixel.

Note that, in the present embodiment as well, as examples of arrangements, the other pixels illustrated in (a), (b), (c), and (d) of FIG. 8 can be formed.

Thus, in the light-emitting element 2B of the light-emitting device 1B according to the present embodiment, the green pixel light-emitting layer 8G of the color having the second largest electron affinity among the red pixel light-emitting layer 8R, the green pixel light-emitting layer 8G, and the blue pixel light-emitting layer 8B of the three colors extends in a state of being layered between the red pixel light-emitting layer 8R of the color having the largest electron affinity and the blue pixel light-emitting layer 8B of the remaining color as well.

Thus, the green pixel light-emitting layer 8G having the second largest electron affinity extends in a state of being layered on the blue pixel light-emitting layer 8B having the third largest electron affinity, that is, the smallest electron affinity.

Next, from above, the red pixel light-emitting layer 8R having the largest electron affinity extends in a state of being layered on the green pixel light-emitting layer 8G having the second largest electron affinity. As a result, the blue pixel light-emitting layer 8B, the green pixel light-emitting layer 8G, and the red pixel light-emitting layer 8R are layered in three stages.

As a result, according to this embodiment as well, the patterning step of the red pixel light-emitting layer 8R is not required, and thus it is sufficient to perform the entire patterning step twice for one color. Therefore, an increase in the length of process steps can be further suppressed and the cost associated with the pattern mask can be further reduced.

Third Embodiment

Figure 12:
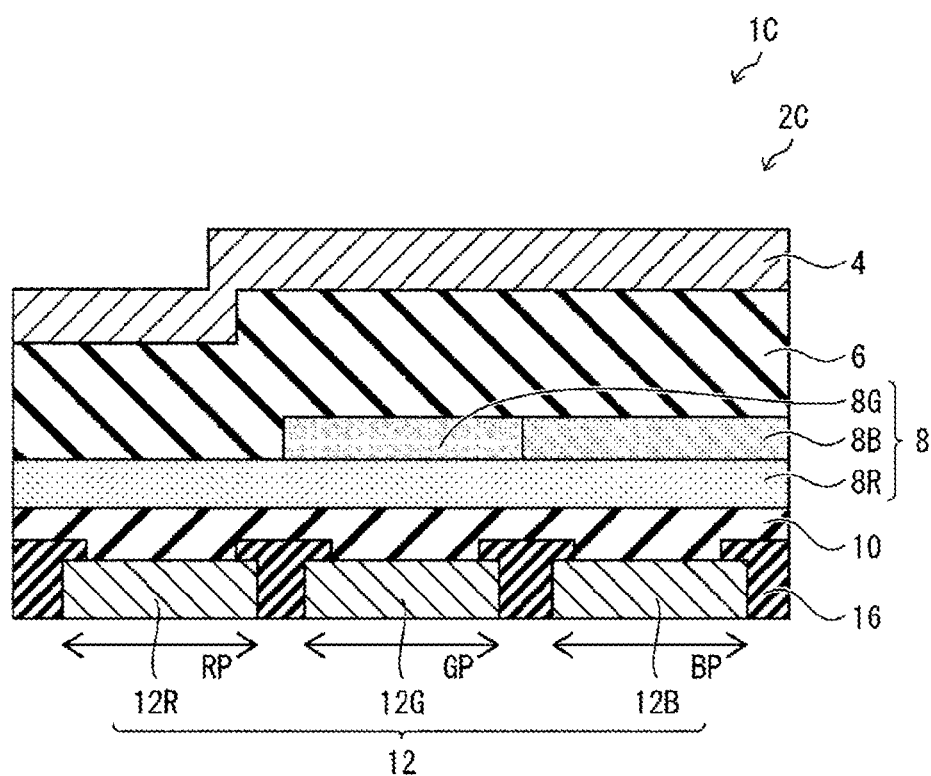
FIG. 12 is a cross-sectional view illustrating a configuration of a light-emitting device including a light-emitting element according to a third embodiment of the disclosure.
Figure 13:
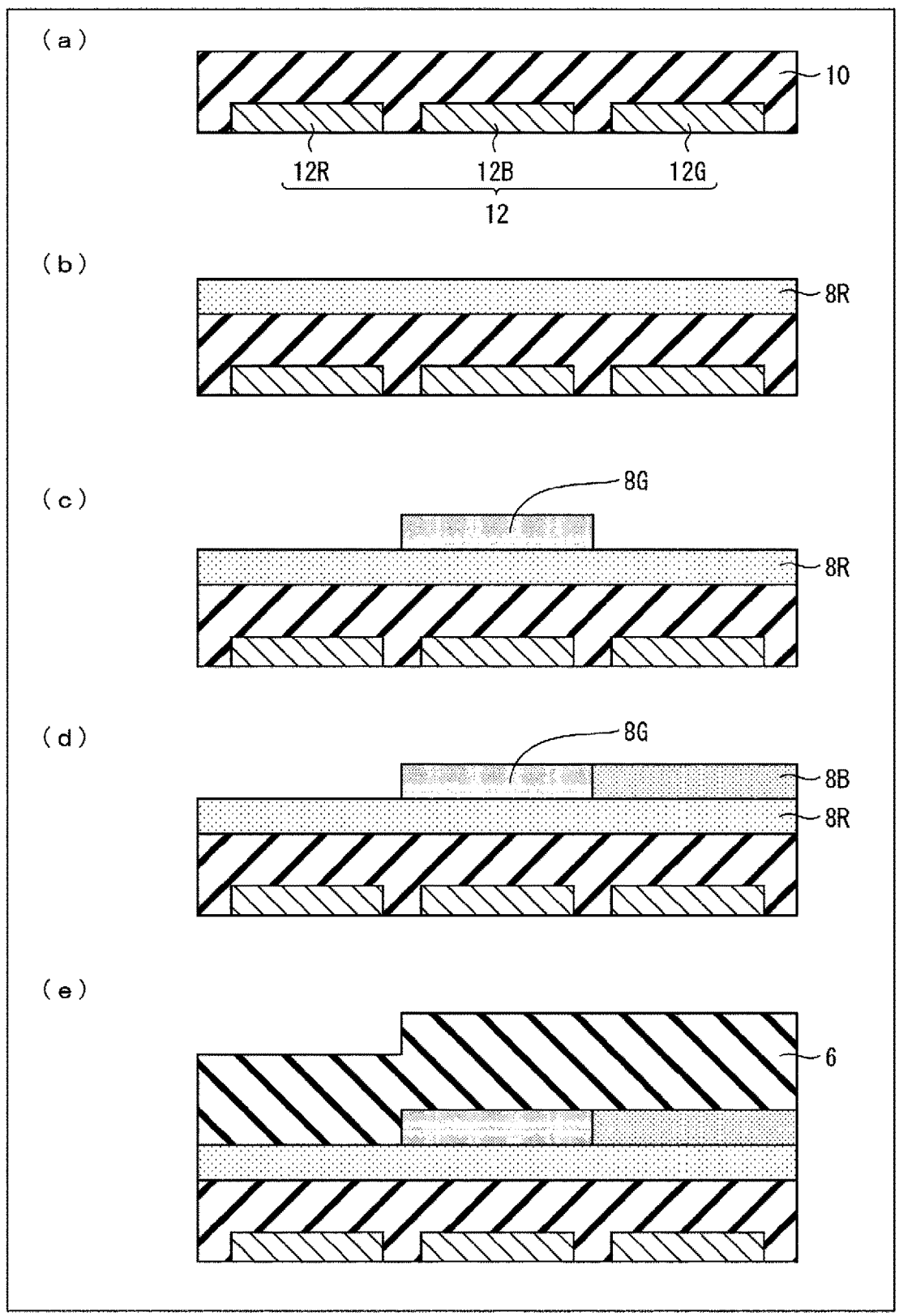
FIGS. 13(a) to 13(e) are cross-sectional views illustrating each step of the manufacturing method of a light-emitting element according to the present embodiment.

With reference to FIG. 12 and FIG. 13, description is given below on yet another embodiment of the disclosure. Note that configurations other than those described in the present embodiment are the same as those of the first and second embodiments. Further, for convenience of the description, members having the same functions as those of the members illustrated in the diagrams in the first and second embodiments are denoted by the same reference symbols, and description thereof is omitted.

The light-emitting element 2A of the light-emitting device 1A of the first embodiment and the light-emitting element 2B of the light-emitting device 1B of the second embodiment are composed of the light-emitting elements 2A, 2B having the so-called normal structure. In contrast, a light-emitting element 2C of a light-emitting device 1C of the present embodiment differs in that the element is composed of the light-emitting element 2C having the so-called invert structure.

A configuration of the light-emitting element 2C of the light-emitting device 1C according to the present embodiment will be described with reference to FIG. 12. FIG. 12 is a cross-sectional view illustrating the configuration of the light-emitting device 1C including the light-emitting element 2C according to the present embodiment.

The light-emitting element 2C of the light-emitting device 1C of the present embodiment is composed of the light-emitting element 2C having a so-called invert structure, and the cathode electrode 12 is provided on the array substrate side (not illustrated).

Specifically, as illustrated in FIG. 12, the red pixel cathode electrode 12R, the green pixel cathode electrode 12G, and the blue pixel cathode electrode 12B composed of the cathode electrode 12, the electron transport layer 10, the light-emitting layer 8, the hole transport layer 6, and the common electrode composed of the anode electrode 4 are layered in this order on the array substrate (not illustrated).

Then, in the present embodiment, in the light-emitting layer 8, the red pixel light-emitting layer 8R is formed on the electron transport layer 10, the green pixel light-emitting layer 8G and the blue pixel light-emitting layer 8B are layered on a portion of the red pixel light-emitting layer 8R, and the hole transport layer 6 is further provided on the red pixel light-emitting layer 8R, the green pixel light-emitting layer 8G, and the blue pixel light-emitting layer 8B.

As a result, in the red subpixel RP, the red pixel light-emitting layer 8R is formed between the red pixel cathode electrode 12R and the anode electrode 4. Further, in the green subpixel GP, the red pixel light-emitting layer 8R and the green pixel light-emitting layer 8G are layered between the green pixel cathode electrode 12G and the anode electrode 4. Further, in the blue subpixel BP, the red pixel light-emitting layer 8R and the blue pixel light-emitting layer 8B are layered between the blue pixel cathode electrode 12B and the anode electrode 4.

Thus, in the light-emitting element 2C having the so-called invert structure, it is possible to provide the light-emitting element 2C capable of reducing the number of times of patterning of the light-emitting layer 8.

A manufacturing method of the light-emitting element 2C having the above-described configuration will be described with reference to (a) to (e) of FIG. 13. (a) to (e) of FIG. 13 are cross-sectional views illustrating each step of the manufacturing method of the light-emitting element 2C according to the present embodiment.

When the light-emitting element 2C of the present embodiment is manufactured, as illustrated in (a) of FIG. 13, the electron transport layer 10 is formed without patterning on the cathode electrode 12, which is a pixel electrode electrically connected to an array substrate (not illustrated), by application, vapor deposition, printing, transfer, or the like. Next, as illustrated in (b) of FIG. 13, the red pixel light-emitting layer 8R is formed on the entire pixel. The formation method is, for example, photolithography, ink-jet, electrodeposition, lift-off, printing, or transfer.

Next, as illustrated in (c) of FIG. 13, the green pixel light-emitting layer 8G is patterned and formed only on the green subpixel GP. The formation method is, for example, photolithography, ink-jet, electrodeposition, lift-off, printing, or transfer.

Next, as illustrated in (d) of FIG. 13, the blue pixel light-emitting layer 8B is patterned and formed only on the blue subpixel BP adjacent to the green pixel light-emitting layer 8G. The formation method is, for example, photolithography, ink-jet, electrodeposition, lift-off, printing, or transfer.

Next, as illustrated in (e) of FIG. 13, the hole transport layer 6 is formed without patterning on the entire pixel. The formation method is, for example, application, vapor deposition, printing, or transfer.

Lastly, although not illustrated, the anode electrode 4 serving as the common electrode is formed on the hole transport layer 6, covering the cathode electrode 12 serving as the subpixel electrodes of each color. The formation method is, for example, application, vapor deposition, printing, or transfer.

The light-emitting element 2C can be formed by the series of steps described above, completing the light-emitting device 1C.

In this way, in the light-emitting element 2C of the light-emitting device 1C according to the present embodiment, the subpixel electrodes of the cathode electrode 12, the electron transport layer 10, the red pixel light-emitting layer 8R, the green pixel light-emitting layer 8G, the blue pixel light-emitting layer 8B, the hole transport layer 6, and the common electrode of the anode electrode 4 are layered in this order. Then, in the green pixel light-emitting layer GP, the red pixel light-emitting layer 8R and the green pixel light-emitting layer 8G are layered in this order between the green pixel cathode electrode 12G and the anode electrode 4. Further, in the blue pixel light-emitting layer BP, the red pixel light-emitting layer 8R and the blue pixel light-emitting layer 8B are layered in this order between the blue pixel cathode electrode 12B and the anode electrode 4.

Thus, in the light-emitting element 2C having the so-called invert structure, it is possible to provide the light-emitting element 2C capable of reducing the number of times of patterning of the red pixel light-emitting layer 8R, the green pixel light-emitting layer 8G, and the blue pixel light-emitting layer 8B.

Fourth Embodiment

Figure 14:
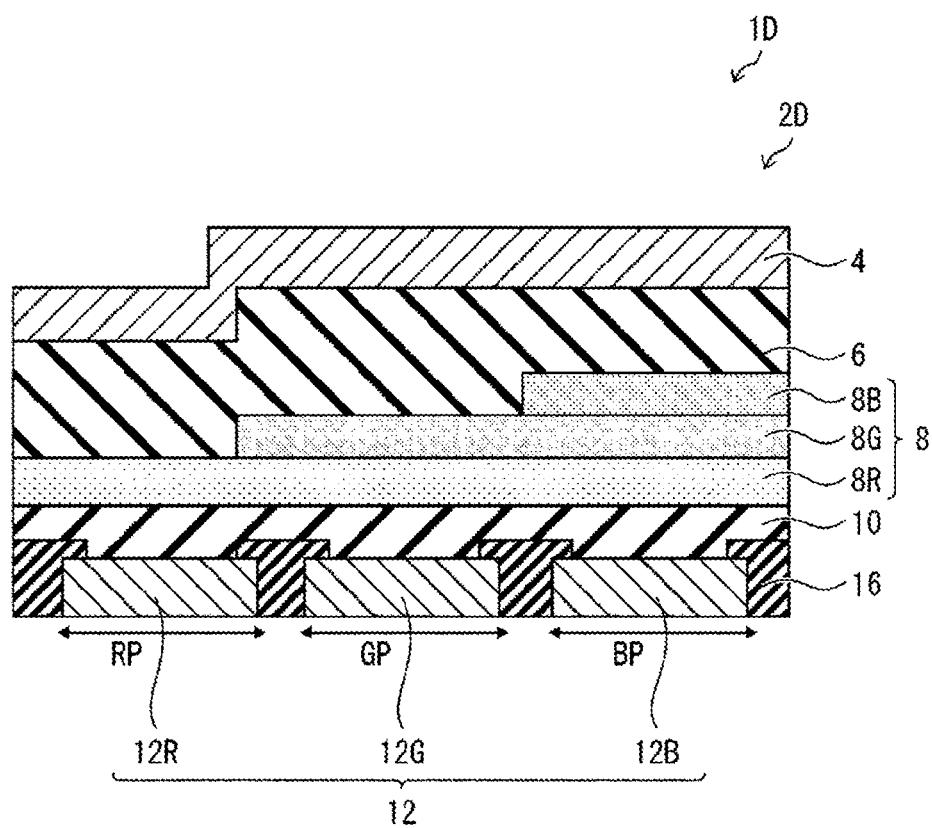
FIG. 14 is a cross-sectional view illustrating a configuration of a light-emitting device including a light-emitting element according to a fourth embodiment of the disclosure.
Figure 15:
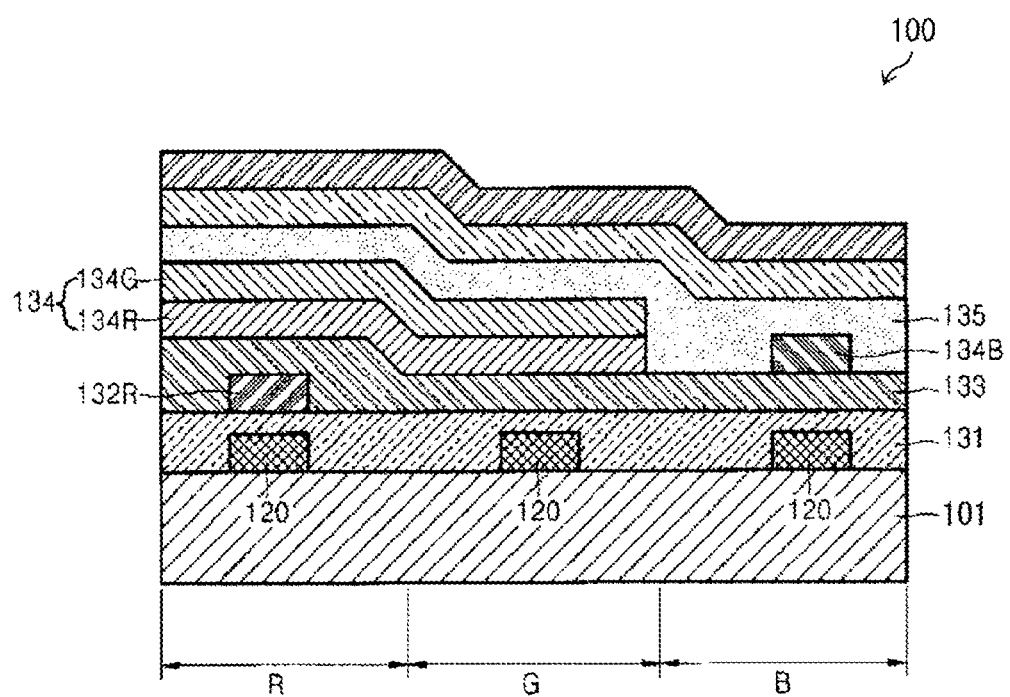
FIG. 15 is a cross-sectional view illustrating a configuration of one example of a light-emitting device in the related art.

The following describes yet another embodiment of the disclosure with reference to FIG. 14. Note that configurations other than those described in the present embodiment are the same as those of the second and third embodiments. Further, for the sake of convenience of description, a member having the same function as the function of the member illustrated in the drawings of the second and third embodiments is denoted by the same reference sign, and description thereof is omitted.

A light-emitting element 2D of a light-emitting device 1D of the present embodiment is composed of the light-emitting element 2D having the so-called invert structure, and differs in that, in the layered state of the red pixel light-emitting layer 8R, the green pixel light-emitting layer 8G, and the blue pixel light-emitting layer 8B of the light-emitting layer 8, the green pixel light-emitting layer 8G is layered on the blue pixel light-emitting layer 8B as well, similar to the second embodiment.

A configuration of the light-emitting element 2D of the light-emitting device 1D according to the present embodiment will be described with reference to FIG. 14. FIG. 14 is a cross-sectional view illustrating a configuration of the light-emitting device 1D including the light-emitting element 2D according to the present embodiment.

The light-emitting element 2D of the light-emitting device 1D according to the present embodiment is composed of the light-emitting element 2D having the so-called invert structure, the red pixel light-emitting layer 8R is layered in the green pixel cathode electrode 12G and the blue pixel cathode electrode 12B, and the green pixel light-emitting layer 8G is also layered in the blue pixel cathode electrode 12B.

Specifically, as illustrated in FIG. 14, the red pixel cathode electrode 12R, the green pixel cathode electrode 12G, and the blue pixel cathode electrode 12B composed of the cathode electrode 12, the electron transport layer 10, the light-emitting layer 8, the hole transport layer 6, and the common electrode composed of the anode electrode 4 are layered in this order on an array substrate (not illustrated).

Then, in the present embodiment, in the light-emitting layer 8, the red pixel light-emitting layer 8R is formed without patterning on the electron transport layer 10 across the entire pixel. Further, the green pixel light-emitting layer 8G is patterned and formed on a portion of the red pixel light-emitting layer 8R in a region of the green subpixel GP and a region of the blue subpixel BP. Furthermore, in a region of the blue subpixel BP, the blue pixel light-emitting layer 8B is patterned and formed on a portion of the green pixel light-emitting layer 8G.

Furthermore, the hole transport layer 6 is provided on the light-emitting layer 8.

As a result, in the red subpixel RP, the red pixel light-emitting layer 8R is formed between the red pixel cathode electrode 12R and the anode electrode 4. Further, in the green subpixel GP, the red pixel light-emitting layer 8R and the green pixel light-emitting layer 8G are layered between the green pixel cathode electrode 12G and the anode electrode 4. Furthermore, in the blue subpixel BP, the red pixel light-emitting layer 8R, the green pixel light-emitting layer 8G, and the blue pixel light-emitting layer 8B are layered between the blue pixel cathode electrode 12B and the anode electrode 4.

Thus, in the light-emitting element 2D having the so-called invert structure, it is possible to provide the light-emitting element 2D capable of reducing the number of times of patterning of the light-emitting layer 8.

Note that the disclosure is not limited to each of the embodiments described above, and various modifications may be made within the scope of the claims. Embodiments obtained by appropriately combining technical approaches disclosed in each of different embodiments also fall within the scope of the technique of the disclosure. Furthermore, novel technical features can be formed by combining the technical approaches disclosed in the embodiments.

The invention claimed is:

1. A light-emitting element comprising:
pixel electrodes provided for individual subpixels of at least three colors;
a common electrode provided facing each of the pixel electrodes; and
light-emitting layers of each of the at least three colors provided, respectively, between the common electrode and, each of the pixel electrodes,
wherein one of each of the pixel electrodes and the common electrode is a cathode electrode and another one of each of the pixel electrodes and the common electrode is an anode electrode,
among the light-emitting layers of each of the at least three colors, a light-emitting layer of a color of the at least three colors having a largest electron affinity extends in a state of being layered between the cathode electrode and each light-emitting layer of other colors of the at least three colors,
the light-emitting layers of each of the at least three colors each includes quantum dot particles, and
in the light-emitting layers of each of the at least three colors being layered, a particle length of the quantum dot particles included in the light-emitting layers of each of the at least three colors positioned closer to the cathode electrode is longer than a particle length of the quantum dot particles included in the light-emitting layers of each of the at least three colors positioned closer to the anode electrode is long.

2. The light-emitting element according to claim 1, wherein, among the light-emitting layers of each of the at least three colors, a light-emitting layer of a color of the at least three colors having a second largest electron affinity extends in a state of being layered between the light-emitting layer of the color having the largest electron affinity and a light-emitting layer of a remaining color among the light-emitting layers.

3. The light-emitting element according to claim 2, wherein the individual subpixels of the at least three colors include a red subpixel, a green subpixel, and a blue subpixel, and among a red light-emitting layer, a green light-emitting layer, and a blue light-emitting layer serving as the light-emitting layers of each color, the green light-emitting layer having the second largest electron affinity extends in the state of being layered between the red light-emitting layer having the largest electron affinity and the blue light-emitting layer of the remaining color.

4. The light-emitting element according to claim 1, Wherein the individual subpixels of the at least three colors include a red subpixel, a green subpixel, and a blue subpixel, and among a red light-emitting layer, a green light-emitting layer, and a blue light-emitting layer serving as the light-emitting layers of each of the at least three colors, the red light-emitting layer having the largest electron affinity extends in the state of being layered between the cathode electrode and the green light-emitting layer and the blue light-emitting layer of the other colors.

5. The light-emitting element according to claim 1, wherein a light-emitting layer closest to the anode electrode among the light-emitting layers includes five or more layers of quantum dot particles.

6. The light-emitting element according to claim 1, wherein the pixel electrodes of the anode electrode, the light-emitting layers of of the at least three colors, and the common electrode of the cathode electrode are layered in this order, and the light-emitting layers of each of the at least three colors being layered are layered between the anode electrode and the cathode electrode in an ascending order of electron affinity.

7. The light-emitting element according to claim 1, wherein the pixel electrodes of the cathode electrode, the light-emitting layers of of the at least three colors, and the common electrode of the anode electrode are layered in this order, and the light-emitting layers of each of the at least three colors being layered are layered between the cathode electrode and the anode electrode in a descending order of electron affinity.

8. The light-emitting element according to claim 1, wherein an electron transport layer is provided between the light-emitting layers of each of the at least three colors and the cathode electrode, and a hole transport layer is provided between the light-emitting layers of each of the at least three colors and the anode electrode.

9. The light-emitting element according to claim 8, wherein an electron affinity increases in an order of the electron transport layer, a red light-emitting layer, a green light-emitting layer, and a blue light-emitting layer.

10. The light-emitting element according to claim 8, wherein, among the light-emitting layers of each of the at least three colors being layered, a light-emitting layer of a color existing closer to the cathode electrode has a larger electron affinity than a light-emitting layer of a color existing closer to the hole transport layer.

11. The light-emitting element according to claim 8, wherein a difference between electron affinities of the hole transport layer and, among the light-emitting layers, a light-emitting layer in contact with the hole transport layer is greater than a difference in electron affinities between the light-emitting layers being layered.

12. The light-emitting element according to claim 8, wherein a charge transport stopper layer having a larger band gap than those of the light-emitting layers of each of the at least three colors is provided between the light-emitting layers of each of the at least three colors and the electron transport layer.

13. The light-emitting element according to claim 1, wherein the light-emitting layers of each of the at least three colors contain a photosensitive resin.

14. The light-emitting element according to claim 8, wherein a charge injection layer is provided between the light-emitting layers and the cathode electrode, between the light-emitting layers and the anode electrode, between the electron transport layer and the cathode electrode, or between the hole transport layer and the anode electrode.

15. The light-emitting element according to claim 14, wherein the electron transport layer, the hole transport layer, and the charge injection layer are each formed of a common material regardless of the individual subpixels of the at least three colors.

16. The light-emitting element according to claim 1, wherein planar shapes of the light-emitting layers of each of the at least three colors differ from one another according to each color.

17. The light-emitting element according to claim 1, wherein an insulating layer configured to partition the individual subpixels is provided between the individual subpixels, and the light-emitting layer of the color having the largest electron affinity among the light-emitting layers of the at least three colors is formed between the insulating layer and the common electrode as well.

18. The light-emitting element according to claim 1, wherein the light-emitting layer of the color having the largest electron affinity among the light-emitting layers of the at least three colors is formed such that to cover the individual subpixels of the at least three colors.

19. A light-emitting device comprising:
the light-emitting element according to claim 1.

20. A light-emitting element comprising:
pixel electrodes provided for individual subpixels of at least three colors;
a common electrode provided facing each of the pixel electrodes; and
light-emitting layers of each of the at least three colors provided, respectively, between the common electrode and each of the pixel electrodes,
wherein one of each of the pixel electrodes and the common electrode is a cathode electrode and another one of each of the pixel electrodes and the common electrode is an anode electrode, among the light-emitting layers of each of the at least three colors, a light-emitting layer of a color of the at least three colors having a largest electron affinity extends in a state of being layered between the cathode electrode and each light-emitting layer of other colors of the at least three colors, among the light-emitting layers, a light-emitting layer formed on a patterned light-emitting layer differs in a film thickness for each of the individual subpixels, and among the light-emitting layers, a light-emitting layer of an upper layer of a subpixel in which the light-emitting layers are layered has a film thickness thinner than a film thickness of a light-emitting layer of a subpixel in which the light-emitting layers are not layered.

* * * * *